United States Patent
Steinman et al.

(10) Patent No.: US 6,675,976 B2
(45) Date of Patent: Jan. 13, 2004

(54) SYSTEMS AND METHODS FOR AN EXTENSION FOR A NINETEEN-INCH COMMUNICATIONS SWITCH COMPONENT RACK

(75) Inventors: Joseph Steinman, Gunter, TX (US); Greg Lowe, Dallas, TX (US)

(73) Assignee: White Rock Networks, Richardson, TX (US)

( * ) Notice: Subject to any disclaimer, the term of this patent is extended or adjusted under 35 U.S.C. 154(b) by 86 days.

(21) Appl. No.: 10/114,510

(22) Filed: Apr. 1, 2002

(65) Prior Publication Data

US 2003/0183588 A1 Oct. 2, 2003

(51) Int. Cl.$^7$ .................................................. A47F 5/00
(52) U.S. Cl. ...................... 211/26; 312/265.1; 361/678; 361/690
(58) Field of Search .......................... 211/26; 361/676, 361/677, 678, 690, 694, 695; 312/265.1, 265.2, 265.3, 265.4, 265.5, 265.6, 223.2

(56) References Cited

U.S. PATENT DOCUMENTS

| | | | |
|---|---|---|---|
| 4,553,674 A | * 11/1985 | Yoshikawa et al. | 211/26 |
| 5,806,948 A | * 9/1998 | Rowan et al. | 312/265.6 X |
| 6,151,210 A | * 11/2000 | Cercioglu et al. | 361/690 |
| 6,310,783 B1 | * 10/2001 | Winch et al. | 361/797 |
| 6,459,579 B1 | * 10/2002 | Farmer et al. | 361/695 |
| 6,463,997 B1 | * 10/2002 | Nicolai et al. | 361/695 X |

\* cited by examiner

*Primary Examiner*—Robert W. Gibson, Jr.
(74) *Attorney, Agent, or Firm*—Bruce E. Garlick; James A. Harrison

(57) ABSTRACT

A rack assembly includes a nineteen-inch sub-assembly coupled to a four-inch extension that comprises two substantially closed side panels adjacent to each other, two substantially open sides adjacent to each other, a closed top and bottom, a plurality of mounting flanges for attaching the extension to a nineteen-inch sub-assembly and a plurality of embossments for receiving mounting hardware for installing the sub-assembly and extension into a twenty-three-inch rack. The four-inch extension is formed not only to allow a nineteen-inch rack sub-assembly to be installed in a twenty-three-inch rack, but also is formed to conduct air exhausted from a side of the nineteen-inch sub-assembly towards a rear end of the twenty-three-inch rack.

13 Claims, 29 Drawing Sheets

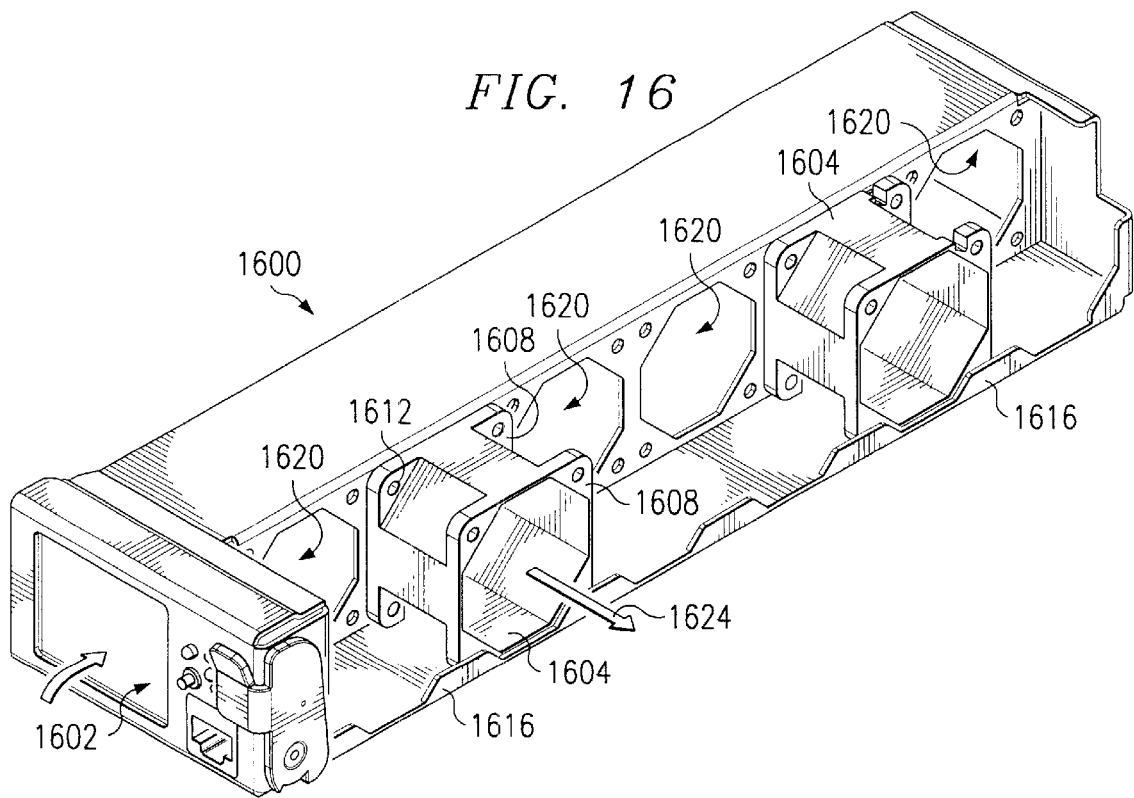

SYSTEMS AND METHODS FOR AN EXTENSION FOR A NINETEEN-INCH COMMUNICATIONS SWITCH COMPONENT RACK

BACKGROUND

1. Technical Field

The present invention relates generally to rack mountable communication system housings that contain integrated circuitry; and more particularly to the manner of construction of such communication system housings.

2. Description of the Related Art

Communication systems are well known and have existed in many forms for quite some time. For example, the public switched telephone network (PSTN) has been in widespread use for many decades. The PSTN is a circuit switched communication network in which communications share time divided bandwidth. Such a circuit switched network is contrasted to the Internet, for example, which is a packet switched network. In packet switched networks, all communications are packetized and transmitted in a packetized format from a source to a destination.

Communication systems include a large number of switches coupled by communication links. The switches include integrated circuitry that perform storage and routing functions for the communications. The communication links may be physical media, e.g., optical fiber, copper, etc., or they may also be wireless, such as microwave links, satellites links, or radio links.

As communication demands have been ever increasing, the loads placed upon both the communication switches and the communication links have also increased. Thus, higher capacity switches and higher capacity communication links have been created to meet these demands. With the wide scale miniaturization of integrated circuits, switches can now be constructed to provide high volume switching but be contained in a relatively small housing. Further, with the development of media such as optical fiber, the communication links are capable of carrying significant levels of communications between switches.

Communication system switches, as is well known, may be high-speed carrier network switches that handle a huge amount of traffic or may be smaller switches, which carry lesser volumes of traffic. The amount of traffic that can be carried by a switch depends not only upon the number and bandwidth of communication links coupled to the switch but the processing capabilities of the switch itself. Thus, to increase the processing capabilities of the switch, it is important to place all components of the switch into a small area to decrease the size of the switch.

As switches become ever smaller they experience significant operational problems. For example, it is desirable to construct switches such that they have a minimum footprint size. Further, it is desirable to modularize the switches into components. Thus, most switches are typically constructed to include a plurality of rack-mounted switch components/housings, each of which performs a portion of the operations of the switch. These rack-mounted switch components are placed vertically with respect to one another. Each of the switch components couples to physical media that forms a communication link and also couples to a back plane of the rack so that the switch component may route traffic to and from other switch components. This rack-mounted structure, therefore, provides great efficiencies in reducing the footprint size of the overall switch and also allows a number of switch components to be efficiently coupled to one another.

However, each switch component produces a large amount of heat because the switch component includes a large number of integrated circuits, each of which produces significant heat. Thus, cooling of the integrated circuits within the switch components is a difficult task. When this task is not properly accomplished, the integrated circuits on the switch components fail, causing the overall capacity of the switch to decrease which may cause disruption in the communication path that includes the switch component.

A further difficulty in such a rack-mounted switch configuration is that the integrated circuits themselves produce electro-magnetic interference (EMI). This EMI may be large enough to interfere with other integrated circuits within the switch components of the rack and may even cause disruption in the back plane coupling the switch components. Further, the Federal Communications Commission limits the amount of EMI energy that may be produced by devices of this type. Thus, it is important to either design the switch components to minimize EMI or provide adequate shielding for the switch components.

Each of the switch components physically includes a circuit board upon which the plurality of integrated circuits is mounted. Coupled to this printed circuit board is a physical media, e.g., optical fiber media. Because of the space limitations for the rack-mounted switch components, it is desirable to minimize the overall depth of the switch component itself. However, in conventional rack-mounted switch components, the optical fiber media is inserted perpendicular to the face of the rack-mounted switch components. This type of mounting increases the depth of the switch component and often results in unintentional bending of, and damage to, the optical fiber media.

Additional difficulties relate to the structure of printed circuit boards that reside within the switch components. Each switch component typically includes at least one circuit board that provides the switching functionality for the switch component. These circuit boards fit within a housing that has a predetermined size and that is received within a rack. Disposed on each circuit board are a plurality of integrated circuits, termination points for physical media, and a connector that couples the circuit board to the back plane of a rack in which a respective housing mounts. When any components of the circuit board fail, the circuit board must be removed from the housing and replaced with an operational circuit board. During this replacement operation, the switching functionality of the circuit board is lost. Thus, redundancies are built into the circuit boards, e.g., parallel media connection points that couple to parallel media, that cause the circuit board to provide its functions even when one component fails, e.g., a media coupler. However, such redundancy does not address problems caused by the failure of integrated circuits upon the circuit board. In such case, the failed circuit board must be fully removed and replaced with a fully functioning circuit board.

Traditional Telecom rack assemblies are made to hold rack sub-assemblies having a twenty-three-inch form factor. Stated differently, the width of a traditional Telecom sub-assembly is twenty-three inches in width. Lately, however, there is a trend to utilize sub-assemblies having a nineteen-inch form factor. Accordingly, vendors of sub-assemblies typically make both nineteen-inch and twenty-three-inch sub-assembly products according to the requirements of the telecommunication service providers.

From the telecommunication service provider's perspective, it must determine whether to go with a particular nineteen-inch or twenty-three-inch sub-assembly according to a plurality of considerations including available space for nineteen- or twenty-three-inch racks and, also, the space within the racks it presently owns or plans to acquire. Thus, logistic issues and space availability considerations may often drive equipment purchase decisions.

Another related issue that should be considered is that twenty-three-inch sub-assembly systems are traditionally made to conduct exhaust from cooling air out of the back side of the sub-assembly. Some sub-assemblies, however, are made to conduct exhaust from cooling air out of one of its two side panels. Accordingly, a nineteen-inch sub-assembly cannot be made to merely fit within a twenty-three-inch rack without violating traditional air exhaust port placement.

These shortcomings, among others, remain unaddressed by prior art rack-mounted communication systems. Thus, there is a need in the art for improvements in such rack-mounted communication systems and components.

SUMMARY OF THE INVENTION

The present invention provides a rack-mount extension that is formed to conduct cooling air exhaust received from a nineteen-inch sub-assembly side panel to a rear exhaust port. The rack extension is formed to attach to the sub-assembly and to enable it to be installed into a rack having a twenty-three-inch form factor. Accordingly, sub-assembly vendors are not required to make sub-assemblies in two different sizes. Additionally, telecommunication service providers are better able to utilize existing racks having twenty-three-inch form factors, in that such racks may be used in place of being forced to use nineteen-inch racks for any nineteen-inch sub-assemblies that are available or that the service provider wants to use.

Other features and advantages of the present invention will become apparent from the following detailed description of the invention are made with reference to the accompanying drawings.

BRIEF DESCRIPTION OF THE DRAWINGS

A better understanding of the present invention can be obtained when the following detailed description of the preferred embodiment is considered in conjunction with the following drawings, in which:

FIG. 16 is a perspective view of a fan tray formed to receive and hold a plurality of fans for cooling a sub-assembly;

DETAILED DESCRIPTION OF THE DRAWINGS

Figure 1:
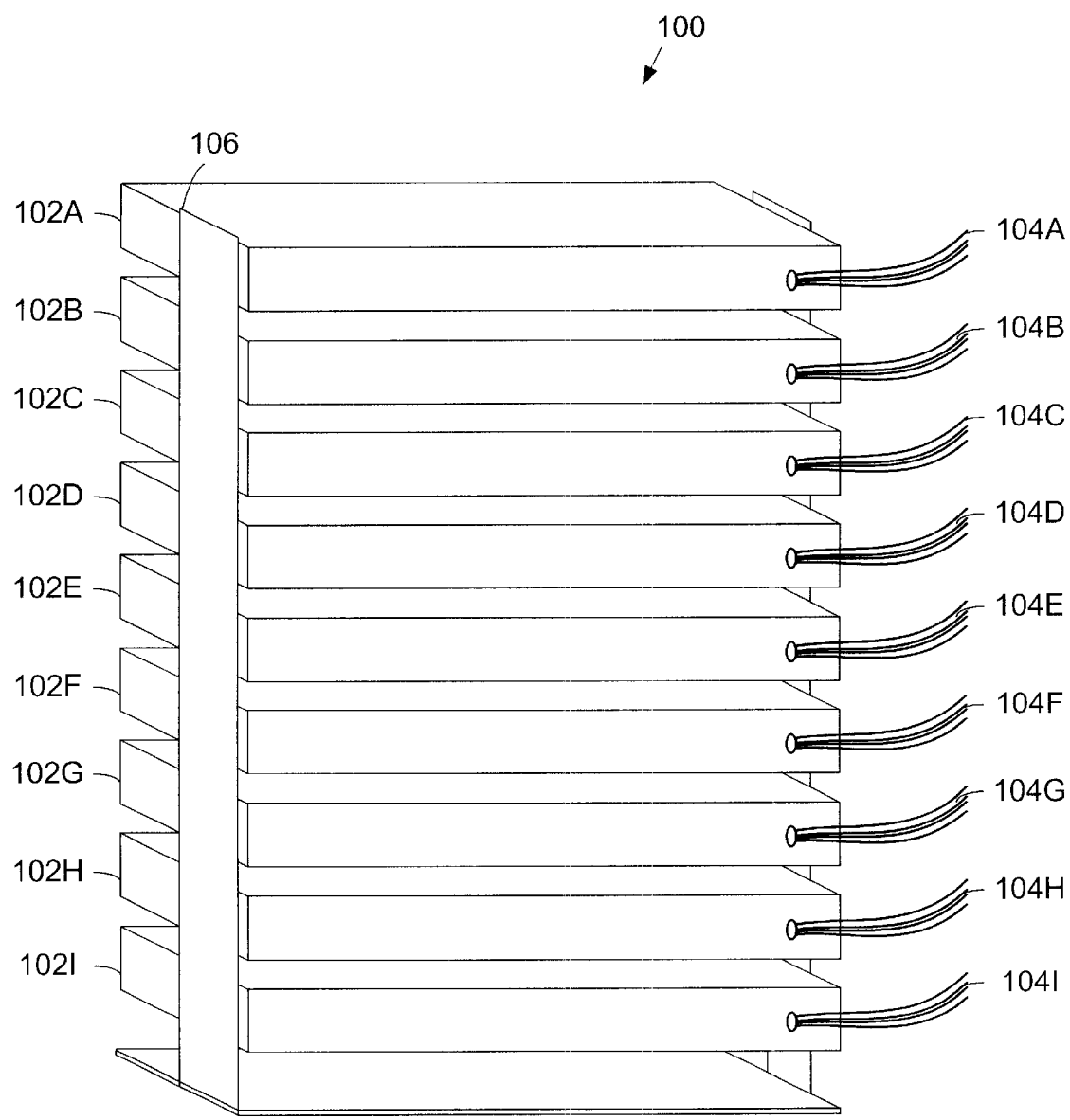
FIG. 1 is a schematic view of a rack-mounted switch that includes a plurality of rack-mounted switch components constructed according to the present invention.

FIG. 1 is a schematic view of a rack-mounted switch 100 that includes a plurality of rack-mounted switch components 102A through 102I constructed according to the present invention. Each of the 19-inch rack-mounted switch components must fit within a space having a maximum dimension of 17.72 inches wide, 12 inches deep and 1¾ inches in height. These dimensions are substantially standardized within the industries for rack-mountable communications and for other communication system rack-mounted equipment. Thus, each rack-mounted switch component includes a housing that contains the other parts of the rack-mounted switch components and, at the same time, conforms to the size limitations.

The rack includes side supports 106 to which the switch components 102A–102I attach. Further, the rack also includes back plane connections to allow the switch components 102A–102I to communicatively intercouple with one another. Such a rack structure is generally known in the art and will not be described further herein except as to expand upon the principles of the present invention.

As is shown, physical media 104A–104I extends switch components 102A–102I, respectively. According to one embodiment of the enclosure of the present invention, the physical media 104A–104I are optical fiber media that exit the enclosure in a direction substantially parallel to a front surface of the switch components 102A–102I housings. By having the media extend in such a direction, with respect to the switch components 102A–102I housings and the rack 100 in which the switch components 102A–102I mount, a lesser depth for the combination of the switch components 102A–102I and the physical media 104A–104I results. In installations in which floor space and access space is limited, this reduction in depth greatly simplifies the installation of the rack 100.

Figure 2:
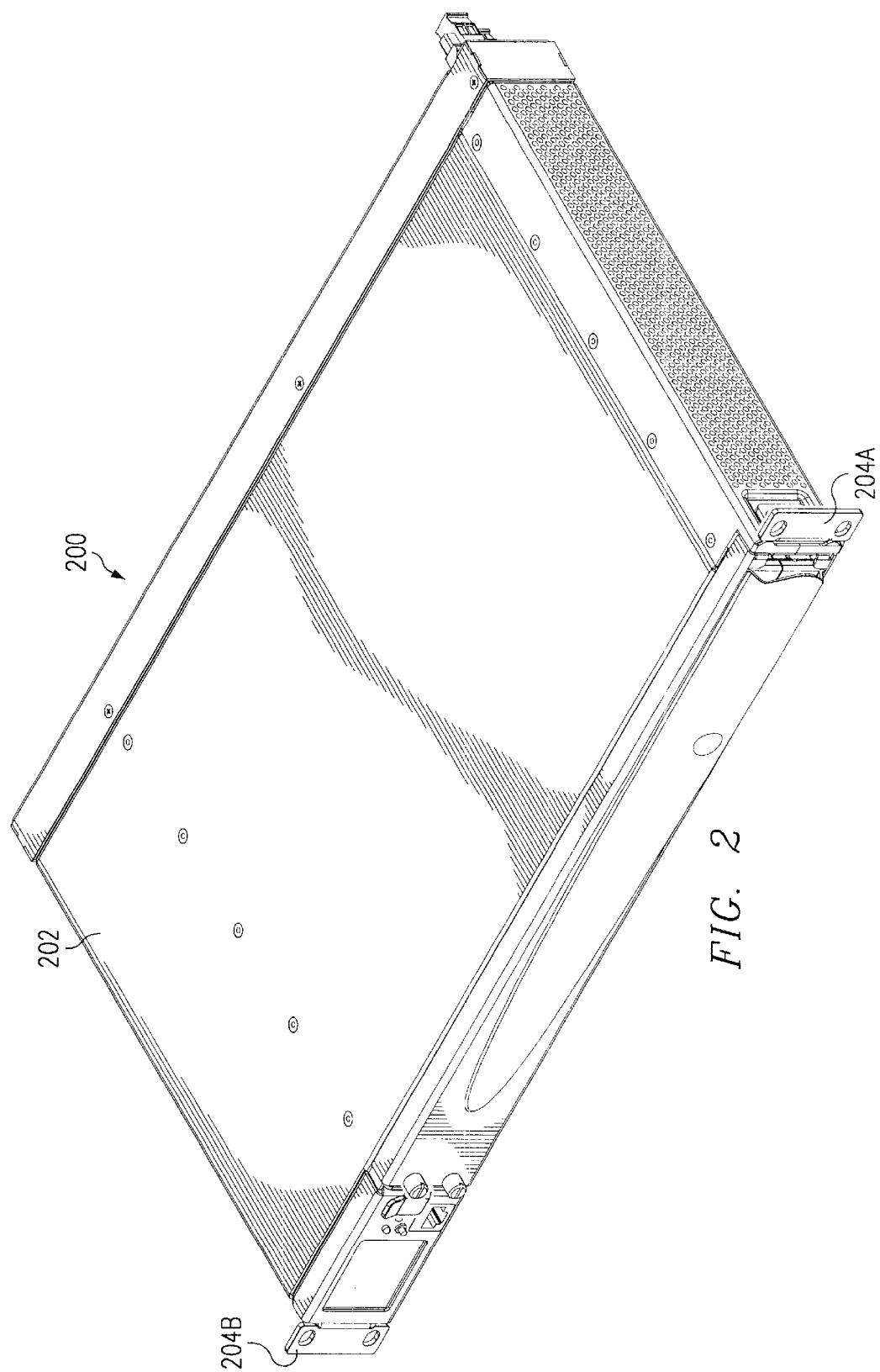
FIG. 2 is a perspective view of a rack-mounted switch component constructed according to the present invention that has been removed from the rack of FIG. 1.

FIG. 2 is a perspective view of a rack-mounted switch component according to the present invention that has been removed from the rack of FIG 1. An external portion of the rack-mounted switch component is referred to as an "enclosure" 200. The enclosure 200 is formed of metal and substantially surrounds all components contained therein. As will be described further with respect to FIG. 3 and subsequent figures, contained within the enclosure 200 are circuit boards, which contain a plurality of integrated circuits, interconnections for the circuit board, cooling fan structure and connection structures for the physical media.

The enclosure 200 includes a metal shell 202 that is formed from a plurality of pieces. The manner in which the metal shell of the enclosure is formed will be described further with reference to FIGS. 4, 5 and 6. The enclosure 200 also includes rack-mounting brackets 204A and 204B for securing the enclosure 200 within the rack as was illustrated in FIG. 1.

Figure 3:
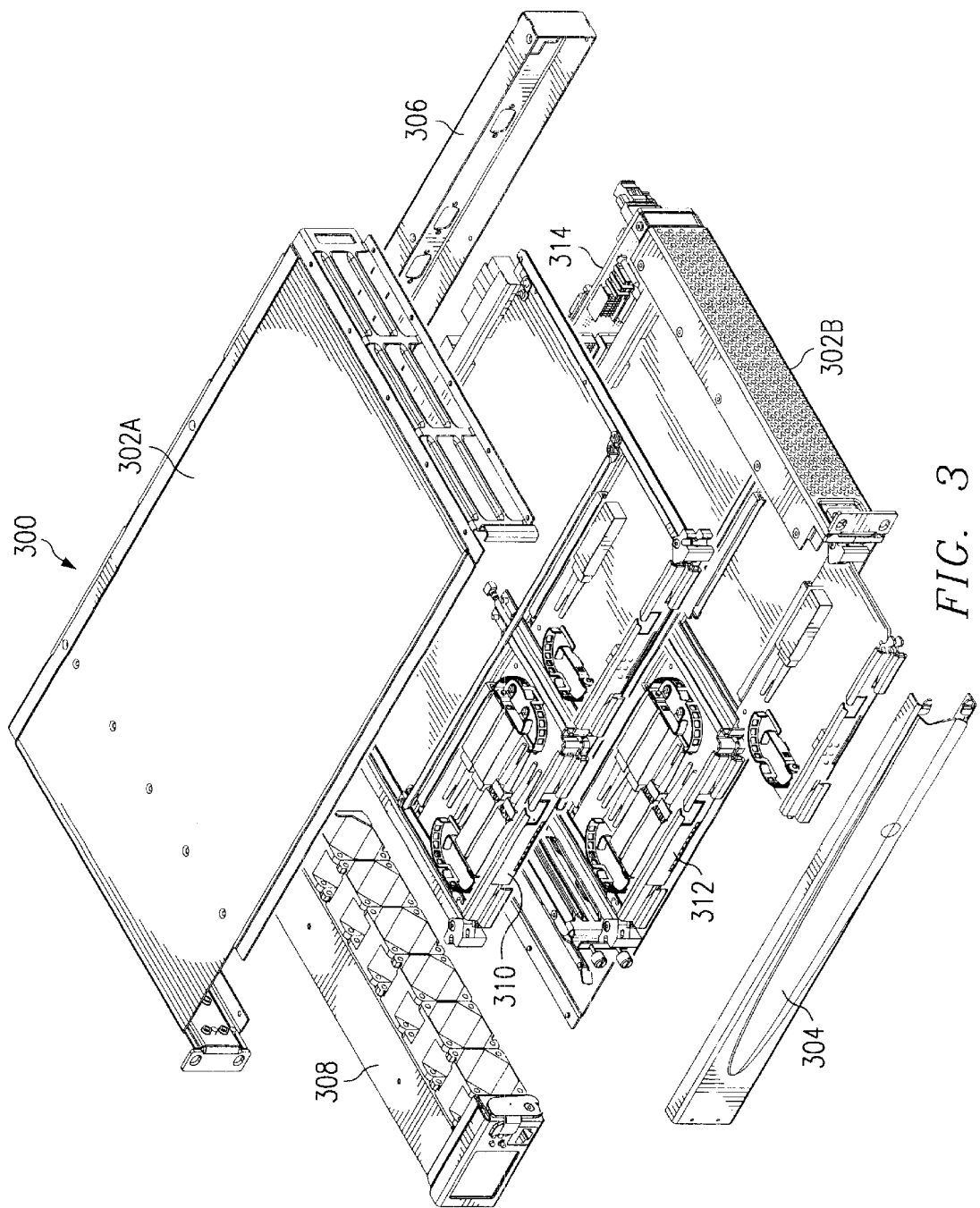
FIG. 3 is an exploded view of the rack-mounted switch component of FIG. 2.

FIG. 3 is an exploded view of the rack-mounted switch component of FIG. 2. As is shown, a rack-mounted switch component 300 includes an enclosure having a system case that includes a first portion 302A and a second portion 302B. The enclosure also includes a front panel 304 and a back panel 306. Contained within the enclosure are a multi-fan module 308, a first motherboard/daughter board combination 310, and a second motherboard/daughter board combination 312. The motherboard and daughter board combinations 310 and 312 are received within the enclosure during normal operation. The back panel 306 of the enclosure includes a back plane connector 314 to which the motherboard/daughter board combinations 310 and 312 connect.

Figure 4:
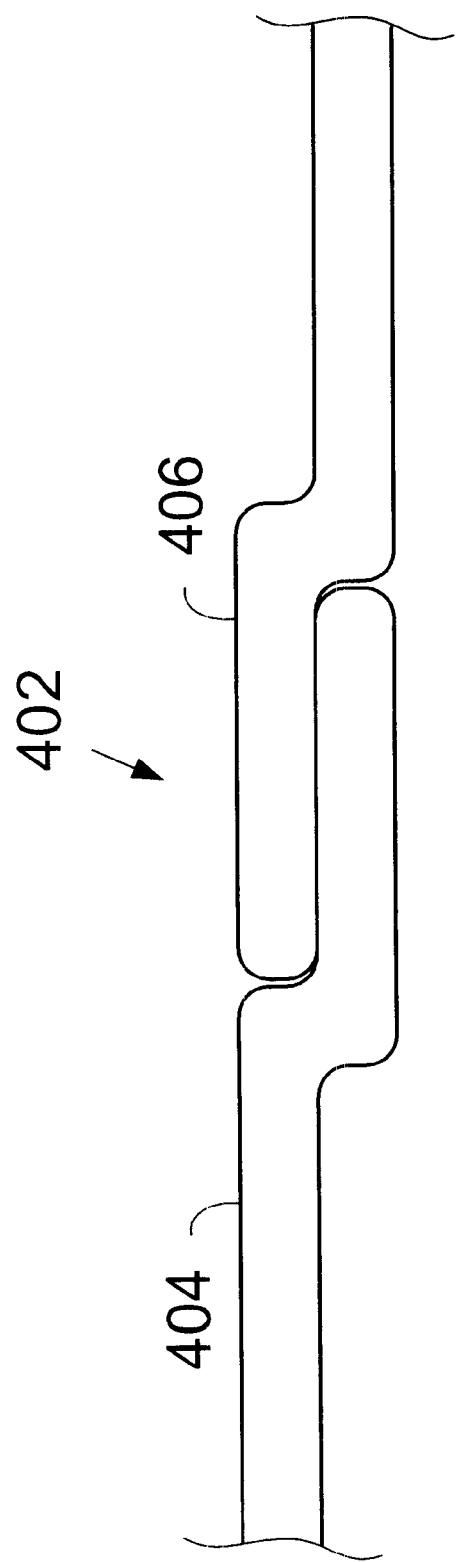
FIG. 4 is a sectional view of a seam of the enclosure of the rack-mounted switch component of FIG. 2.

FIG. 4 is a sectional view of a seam of the enclosure of the rack-mounted switch component of FIG. 2. As shown in FIG. 4, an overlapping seam 402 joins two metal sections 404 and 406 of the enclosure. These two metal sections 404 and 406 may be two of the system case and the front panel, the system case and the back panel, or any other two components of the enclosure. As is shown, this overlapping seam structure 402 eliminates a line of sight from within the enclosure external to the enclosure. Therefore, the seam 402 prevents internally generated electromagnetic radiation interference (EMI) from escaping the enclosure along the seam 402. As is generally known, integrated circuits operating at high switching frequencies generate EMI energy. If this EMI energy escapes the enclosure, it would be EMI that would interfere with operation of other integrated circuits. Thus, the seam structure 402 illustrated in FIG. 4 provides significant shielding for those components contained within the enclosure and also prevents those components within the enclosure from causing interference with other components external to the enclosure.

An additional benefit of the seam structure 402 of FIG. 4 is that it allows the enclosures of the present invention to be constructed with minimal welding. As is generally known, in forming EMI shielded enclosures of metal, it is typical to weld each and every seam of the enclosure fully along the length of the seam. This welding is expensive and delays the construction of the enclosures. The seam 402, as shown in FIG. 4, allows enclosures to be constructed with minimal spot welds or fasteners while still providing superior EMI shielding.

Figure 5:
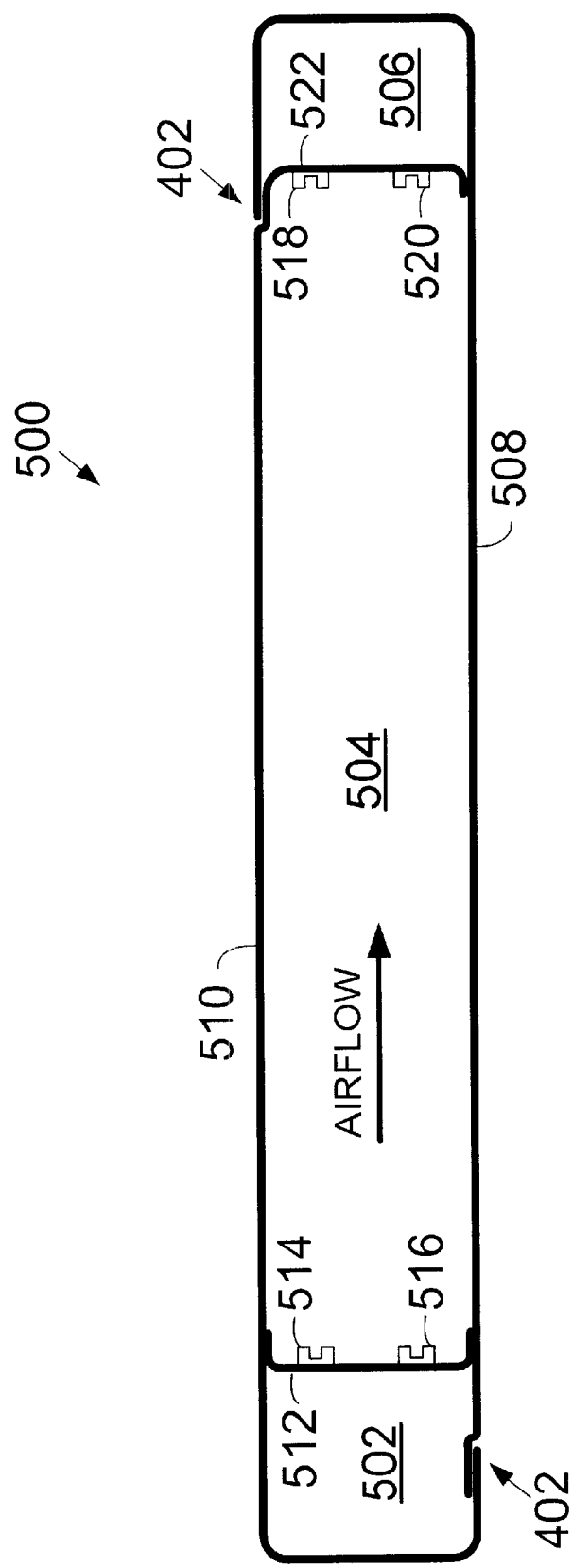
FIG. 5 is a sectional view of one embodiment of an enclosure of the rack-mounted switch component of FIG. 2 constructed according to the present invention.

FIG. 5 is a sectional view of one embodiment of an enclosure 500 of the rack-mounted switch component of FIG. 2 constructed according to the present invention. The enclosure is constructed to include three volumes. A first volume 502 is constructed to accept a multi-fan module. The multi-fan module produces an airflow that passes across the surfaces of two motherboard/daughter board combinations that are received within a second volume 504 of the enclosure. A third volume 506 serves as a plenum area to allow air that has been heated, via passing across the motherboard/daughter board combinations, to exit the enclosure.

In this embodiment, the system case is formed of a first portion 508 and a second portion 510 that are joined using the joints 402 illustrated in FIG. 4. The first portion 508 and second portion 510 of the system case define the third volume 506. Another component 512 of the enclosure serves to segregate the first volume 502 from the second volume 504. The component 512 also provides support for a pair of tracks 514 and 516 that will act as the card guides of the motherboard/daughter board combinations 310 and 312 (of FIG. 3). The structure, 512 is perforated to allow air created by the multi fan modules to pass from the first volume 502 into the second volume 504 that receives the motherboard/daughter board combinations. The first portion 510 of the system case also includes a component 522 that segregates the second volume 504 from the third volume 506. This component 522 supports a pair of tracks 518 and 520 that will receive card guides of the motherboard/daughter board combinations. This component 522 of the first portion 510 of the system case also includes perforations that allow heated cooling air to pass from the second volume 504 to the third volume 506. This heated air is vented from the third volume 506 to exit the enclosure of the system component. Thus as with the structure of FIG. 5, the enclosure may be constructed fairly simply from pre formed metal sheeting with minimal welds required and provide significant EMI shielding.

Figure 6:
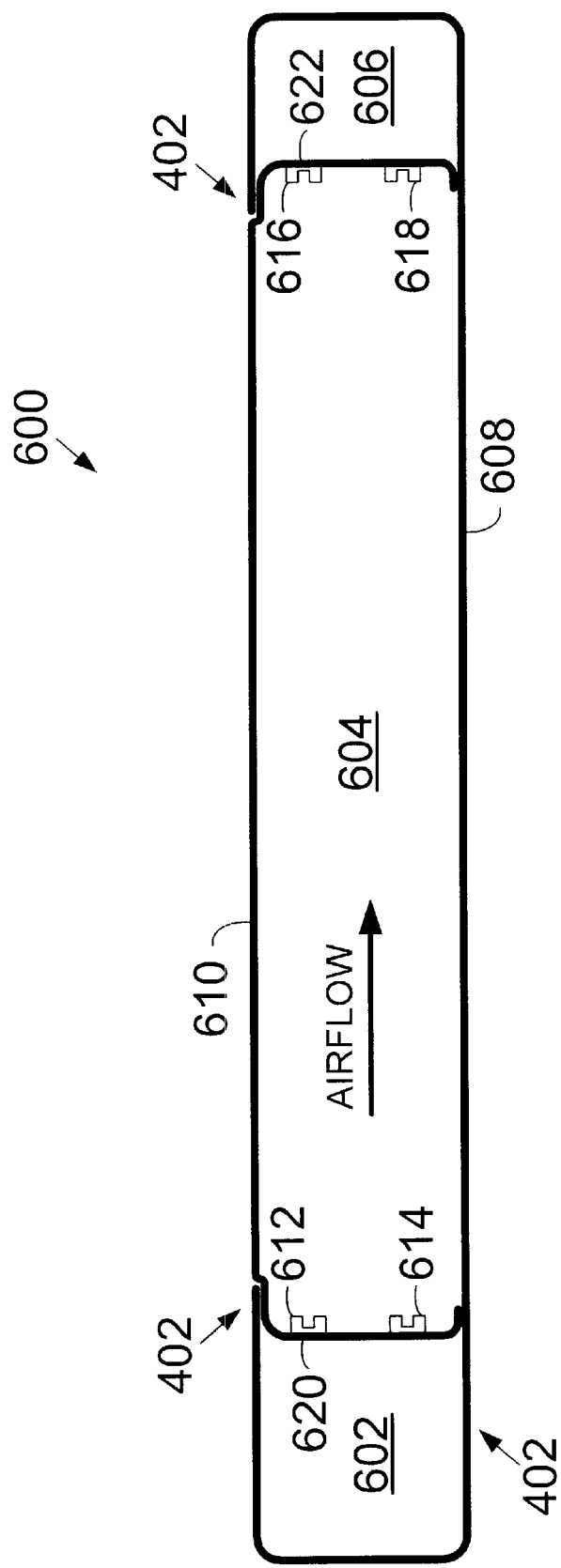
FIG. 6 is a sectional view of a second embodiment of an enclosure of the rack-mounted switch component of FIG. 2 constructed according to the present invention.

FIG. 6 is a sectional view of a second embodiment of an enclosure of the rack-mounted switch component of FIG. 2 constructed according to the present invention. The second embodiment of the enclosure includes a first volume 602 for receiving a multi-fan module, a second volume 604 for receiving the pair of motherboard/daughter board combinations, and a third volume 606 that serves as a plenum. The system case includes two components 608 and 610 that are preformed of metal. These components 608 and 610 are joined, via the joint structure 402 of FIG. 4, to provide superior EMI shielding. Component 610 also includes tracks 612, 614, 616 and 618 that receive the motherboard/daughter board combinations within volume 604. Perforated portions 620 and 622 of component 610 allow cooling air to flow from the first volume 602 to the second volume 604, and from the second volume 604 to, the third volume 606, respectively.

Figure 7:
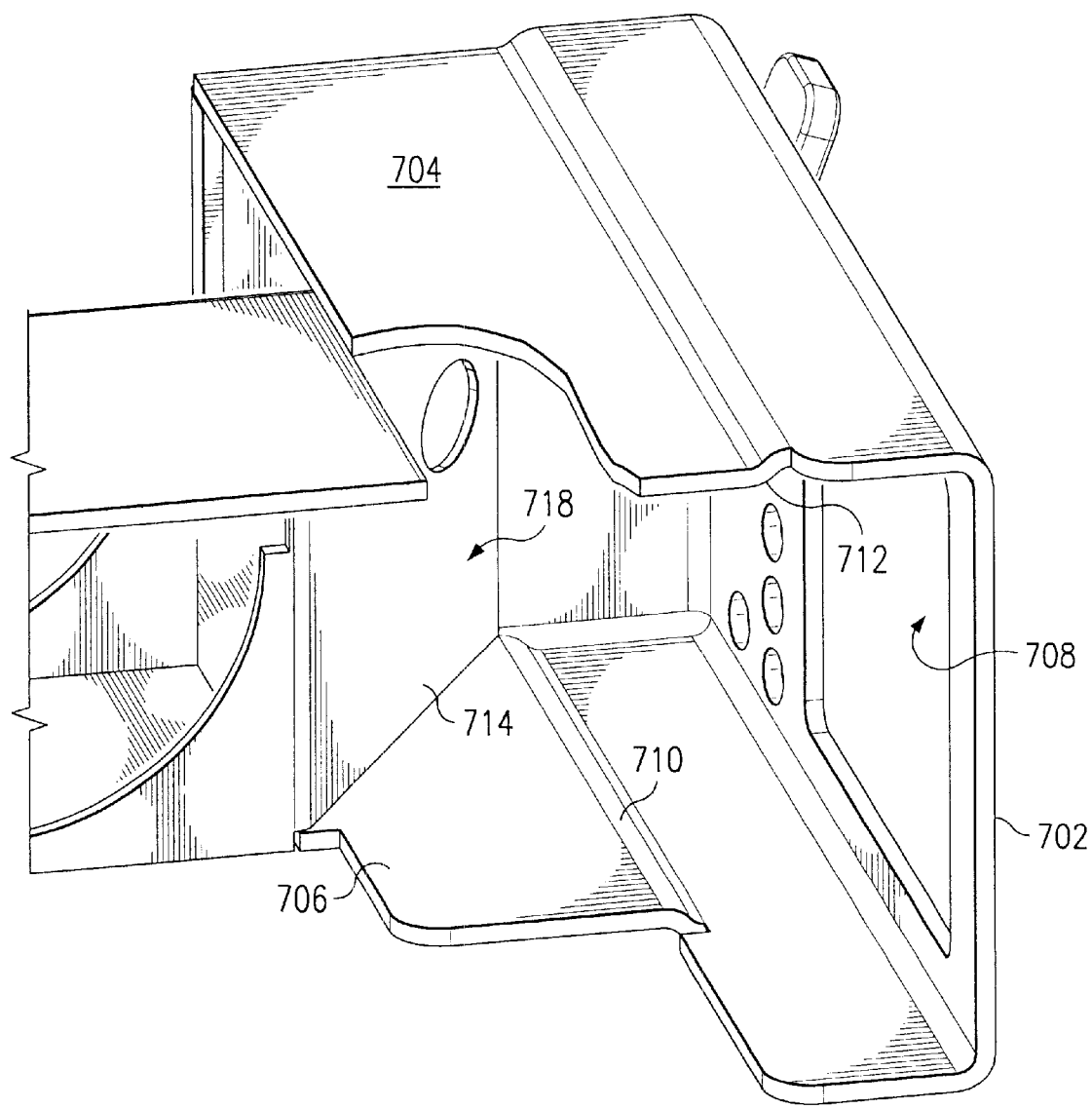
FIG. 7 is a perspective view illustrating the construction of a portion of a multi-fan module of the present invention that assists in preventing EMI leakage from the enclosure.

FIG. 7 is a perspective view illustrating the construction of a portion of a multi-fan module of the present invention that assists in preventing EMI leakage from the enclosure. The multi-fan module resides within the first volume (e.g., the first volume 502 of FIG. 5 and the first volume 602 of FIG. 6) of a housing that is constructed to minimize EMI leakage. Because the multi-fan module must have a substantially uninhibited opening external to the enclosure so that it may receive cool air for cooling the motherboard/daughter board combinations, it must avoid having a line of sight path external to the enclosure. Thus, the structure of this portion of the multi-fan module includes a front panel 702, a top panel 704, M and a bottom panel 706. Also included is an opening 708 that allows air to be drawn into the multi-fan module from external in to the enclosure. An inner panel 718 joins top panel 704 and bottom panel 706 and helps prevent EMI leakage through opening 708.

Curved surfaces 710 and 712 formed in bottom panel 706 and top panel 704, respectively, serve to reduce/preclude EMI leakage through opening 708. In particular, curved surfaces 710 and 712, in combination with front panel 702 and inner panel 714, provide a trapping mechanism for internally produced EMI. Thus, free airflow may pass through opening 708 and along a surface 718 of panel 714 into the multi-fan module for cooling the motherboard/daughter board combinations.

Figure 8:
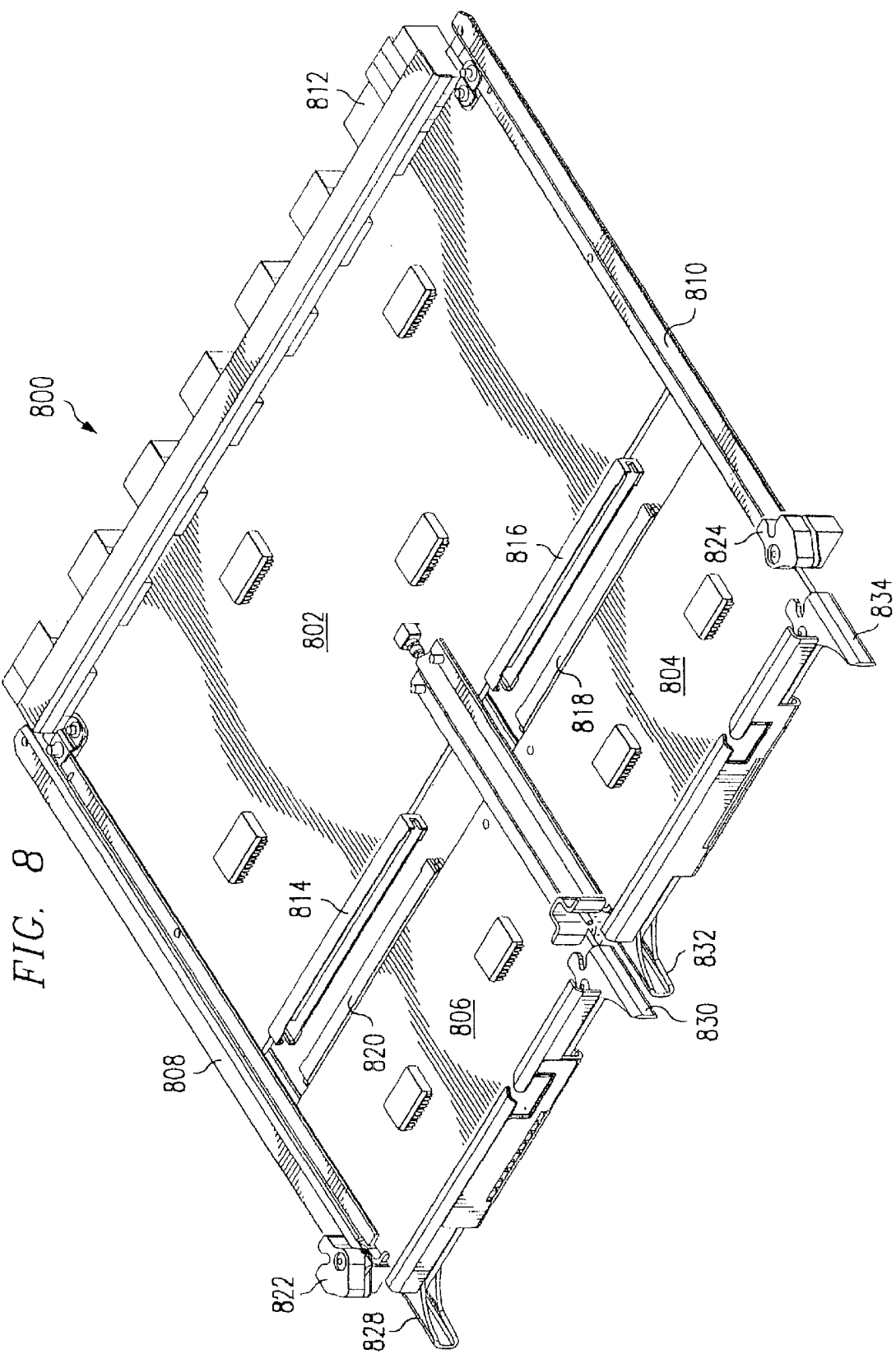
FIG. 8 is a schematic view of a motherboard and two daughter boards constructed according to the present invention.

FIG. 8 is a schematic view of a motherboard and two daughter boards constructed according to the present invention. As shown in FIG. 8, a motherboard/daughter board combination 800 includes a motherboard 802, a daughter board 804, and a daughter board 806. Contained upon both surfaces of motherboard 802 are integrated circuits. These integrated circuits may be mounted to motherboard 802 via hole connections or surface mount connections. The manner in which integrated circuits are affixed to circuit boards is generally known and will not be discussed further herein except as to expand upon the teachings of the present invention.

Integrated circuit components and media connectors are affixed to both surfaces of daughter boards 804 and 806. The structure of circuit boards that include media connectors and integrated circuits is also known and will not be described further except as to expand upon the teachings of the present invention. Fixed to the motherboard 802 is a pair of card guides 808 and 810. These card guides 808 and 810 matingly engage a pair of tracks (e.g., tracks 612 and 616 of FIG. 6) contained within an enclosure. With the motherboard: fully engaged within the enclosure, a back plane connector 812 fixed to the motherboard 802 couples to a back plane connector contained within the enclosure. In this fashion, the motherboard 802 may communicate with other devices coupled to the back plane connector of a rack in which the enclosure mounts via the back plane connector of the enclosure.

Each of the daughter boards 804 and 806 matingly engages with the motherboard 802 via connectors. For example, daughter board 804 includes a connector 818, which engages a connector 816 of motherboard 802. Likewise, daughter board 806 includes a connector 820, which engages a connector 814 of motherboard 802. The manner in which the daughter boards 804 and 806 couple to the motherboard 802 is in a co-planer fashion. In this co-planer fashion, daughter boards 804 and 806 reside in substantially the same plane as the motherboard 802. By having this co-planer connection, the daughter boards 804 and 806 may be removed from the motherboard 802 without removing the motherboard 802 from the enclosure. This provides significant benefits in replacing daughter boards that have failed components without disabling the operation of the motherboard. For example, in one embodiment, daughter boards 804 and 806 provide redundancy in communication paths provided by coupled media. If one of the daughter boards fails, e.g., daughter board 804, the failed daughter board 804 may be separated from the motherboard 802 without disabling the other daughter board 806 or the motherboard 802.

To support this co-planer functionality, the latching mechanism with which the daughter boards 804 and 806 couple to the motherboard 802 and the manner in which the motherboard 802 couples to the enclosure is a significant improvement over prior devices. The latching structure that latches the motherboard 802 to the enclosure includes a first extractor 822 and a second extractor 824. These extractors 822 and 824 couple to the card guides 808 and 810, respectively, and may only be disengaged from the enclosure when the daughter boards 804 and 806 are disengaged from the motherboard 802. Extractors 828 and 830 couple the daughter board 806 to the motherboard 802. Further, extractors 832 and 834 couple the daughter board 804 to the motherboard 802. Extractors 828 and 834 are constructed to be coexistent with extractors 822 and 824, respectively.

Figure 9:
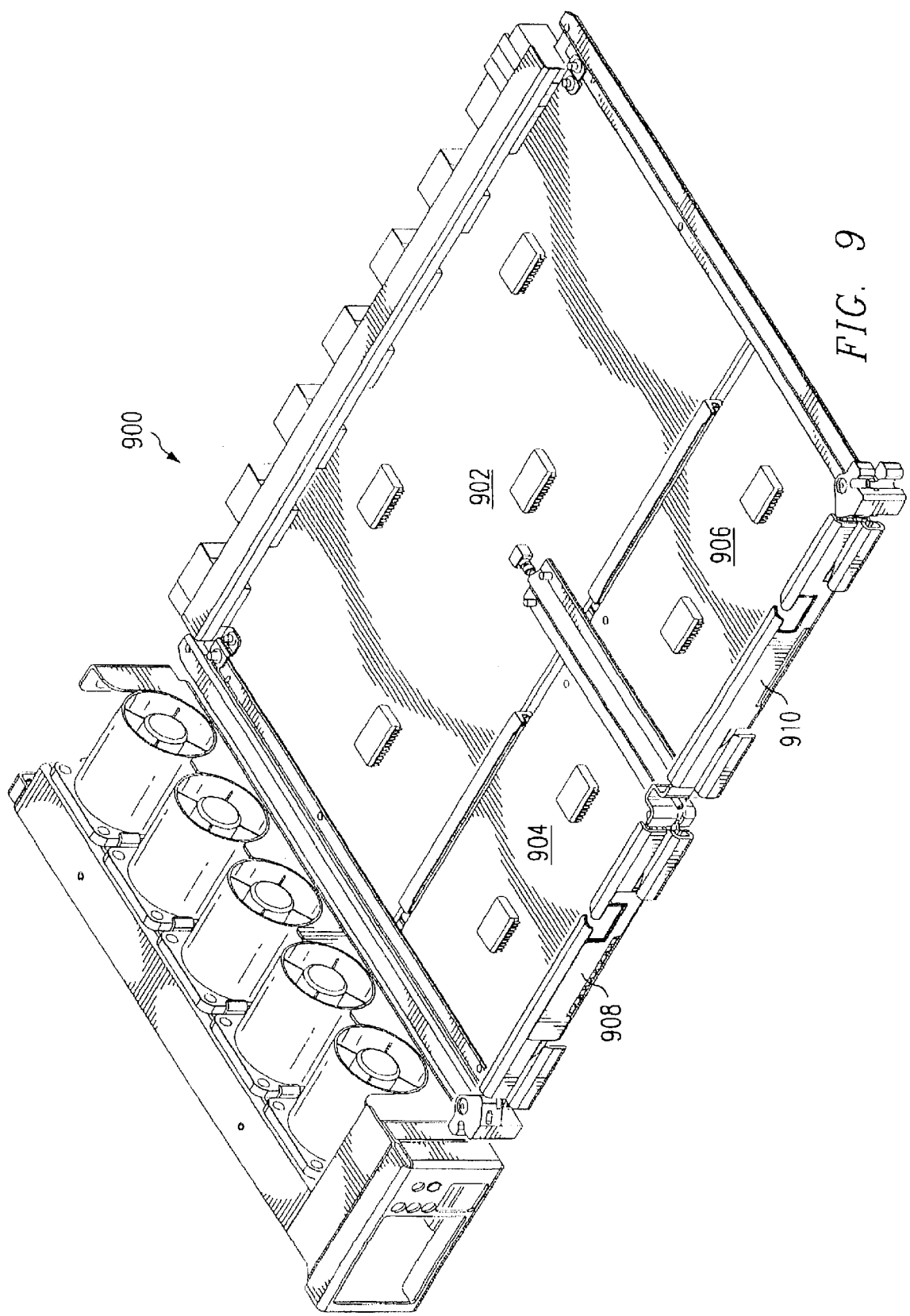
FIG. 9 is a schematic view illustrating the relative positioning of the multi-fan module, the motherboard and daughter boards of the present invention.

FIG. 9 is a schematic view illustrating the relative positioning of the multi-fan module, the motherboard and daughter boards of the present invention. As shown in FIG. 9, a multi-fan module 900 resides adjacent a motherboard 902. Connected to motherboard 902 are daughter boards 904 and 906. As was previously described, the multi-fan module 900 produces an airflow that is directed across the upper and lower surfaces of the motherboard 902 and the upper and lower surfaces of daughter boards 904 and 906 to cool the integrated circuit components disposed thereon. FIG. 9 also shows face plates 908 and 910 disposed upon daughter boards 904 and 906, respectively. These face plates 908 and 910 assist in preventing EMI produced by the components of motherboard 902 and daughter boards 904 and 906 from escaping the enclosure.

Figure 10A:
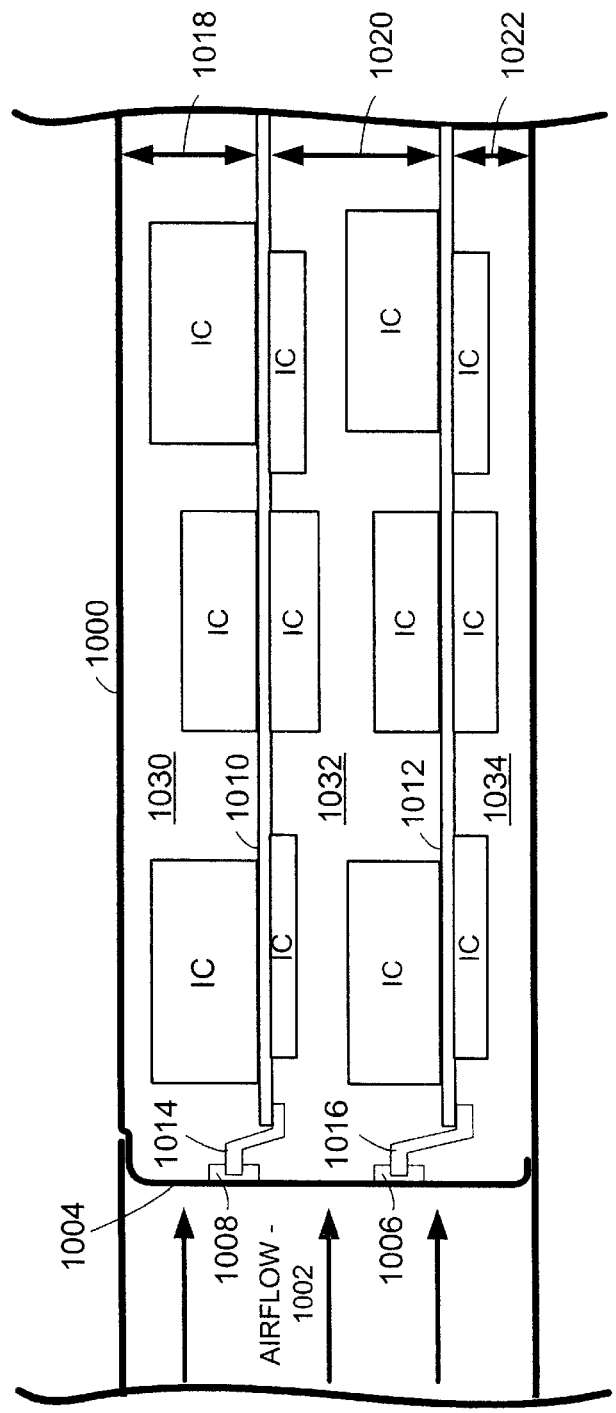
FIG. 10A is a diagrammatic sectional view showing the construction of card guides, according to the present invention, that causes a diverted airflow.

FIG. 10A is a diagrammatic sectional view showing the construction of card guides according to the present invention that causes a diverted airflow. As shown in FIG. 10, the multi-fan module produces an airflow 1002 that passes through a dividing wall 1004 having airflow openings thereupon. The airflow 1002 enters a second volume of the enclosure in which motherboards 1010 and 1012 (and coupled daughter boards) are contained. Fixed to the dividing wall 1004 are tracks 1014 and 1016 that receive card guides 1014 and 1016.

Contained upon the motherboards 1010 and 1012 are integrated circuits (ICs). These integrated circuits are contained on both surfaces of the motherboards 1010 and 1012. As is known, integrated circuit components generate substantial amounts of heat that must be removed from the integrated circuits to prevent the integrated circuits from over-heating and failing. Thus, the airflow 1012 passes across the surfaces of the motherboards 1010 and 1012 to remove the heat generated by the integrated circuits. According to the present invention, card guides 1014 and 1016 are designed to control the volume of airflow 1002 so that it advantageously and effectively cools all integrated circuits contained upon the motherboards 1010 and 1012.

Figure 10B:
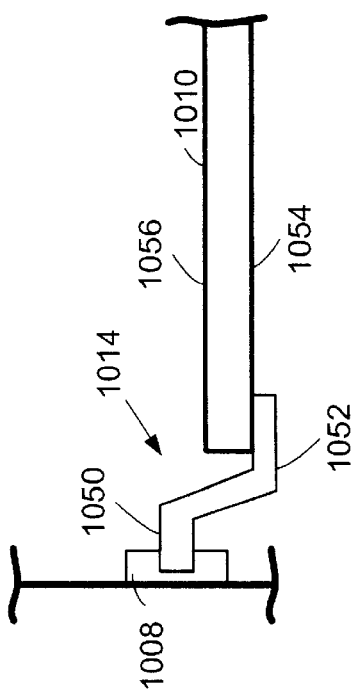
FIG. 10B is a diagrammatic sectional view of a card guide constructed according to the present invention.

FIG. 10B is a diagrammatic sectional view of a card guide constructed according to the present invention. Referring now to FIG. 10B, the elongated guide includes a first portion 1050 that slidingly engages the track 1008 and a second portion 1052 that is affixed to the motherboard 1010. As is shown, the second portion 1052 of the elongated guide 1014 is offset from the first portion 1050 of the elongated guide. Such offset of the first portion 1050 to the second portion 1052 alters the airflow 1002 applied to a bottom surface of the circuit board 1054 and to a top surface 1056 of the motherboard 1010. The structure of the elongated guides 1014 and 1016 are designed to correctly divert appropriate portions of the airflow 1002 to the various surfaces of the motherboards 1010 and 1012.

Referring again to FIG. 10A, the second volume within the, enclosure occupied by the motherboards/daughter boards 1010 and 1012, may be subdivided into 3 particular sub volumes. A distance 1018, that is, the distance between the top inner surface of the enclosure 1000 and an upper surface of motherboard 1010, corresponds to a first sub volume 1030. A second distance 1020 is the distance between a lower surface oft he upper motherboard 1010 and an upper surface of the lower motherboard 1012 and corresponds to a second sub volume 1032. A third distance, distance 1022, is the distance between an inner surface of the lower side of the enclosure 1000 and the lower surface of motherboard 1012 and corresponds to a third sub volume 1034.

According to the present invention, integrated circuitry is laid out on both sides of the motherboards 1010 and 1012. Further, integrated circuitry is also laid out on daughter, boards that couple to the motherboards. These daughter boards are not shown in the sectional view of FIG. 10A but their structure will be apparent to the reader from viewing the other drawings. Each of the integrated circuits contained on the surfaces of the motherboards 1010 and 1012, as well as the daughter boards, generates heat. Because the motherboards 1010 and 1012, as well as the daughter boards, are good thermal insulators, the heat generated in each of the sub volumes 1030, 1032 and 1034 must be removed in a direction parallel to the surfaces of the motherboards 1012 and 1010. Since the total cooling provided by the airflow 1002 is known, the card guides 1014 and 1016 have offsets to divert airflow based upon the heat that is generated within each of the volumes 1030, 1032, and 1034.

Given that a particular airflow volume 1002 is sufficient to cool all integrated circuits contained within sub volumes 1030, 1032, and 1034, the offsets are determined to produce optimum cooling. Integrated circuits that are more temperature sensitive, i.e., that cannot be operated at higher temperatures, are placed on the motherboards 1010, 1012 and the daughter boards to be closer to the multi-fan module such that they receive a larger cooling airflow. Further, integrated circuits that produce higher levels of heat and/or are less temperature sensitive may be placed on portions of the motherboards 1010 and 1012 farther from the multi-fan module.

Figure 11A:
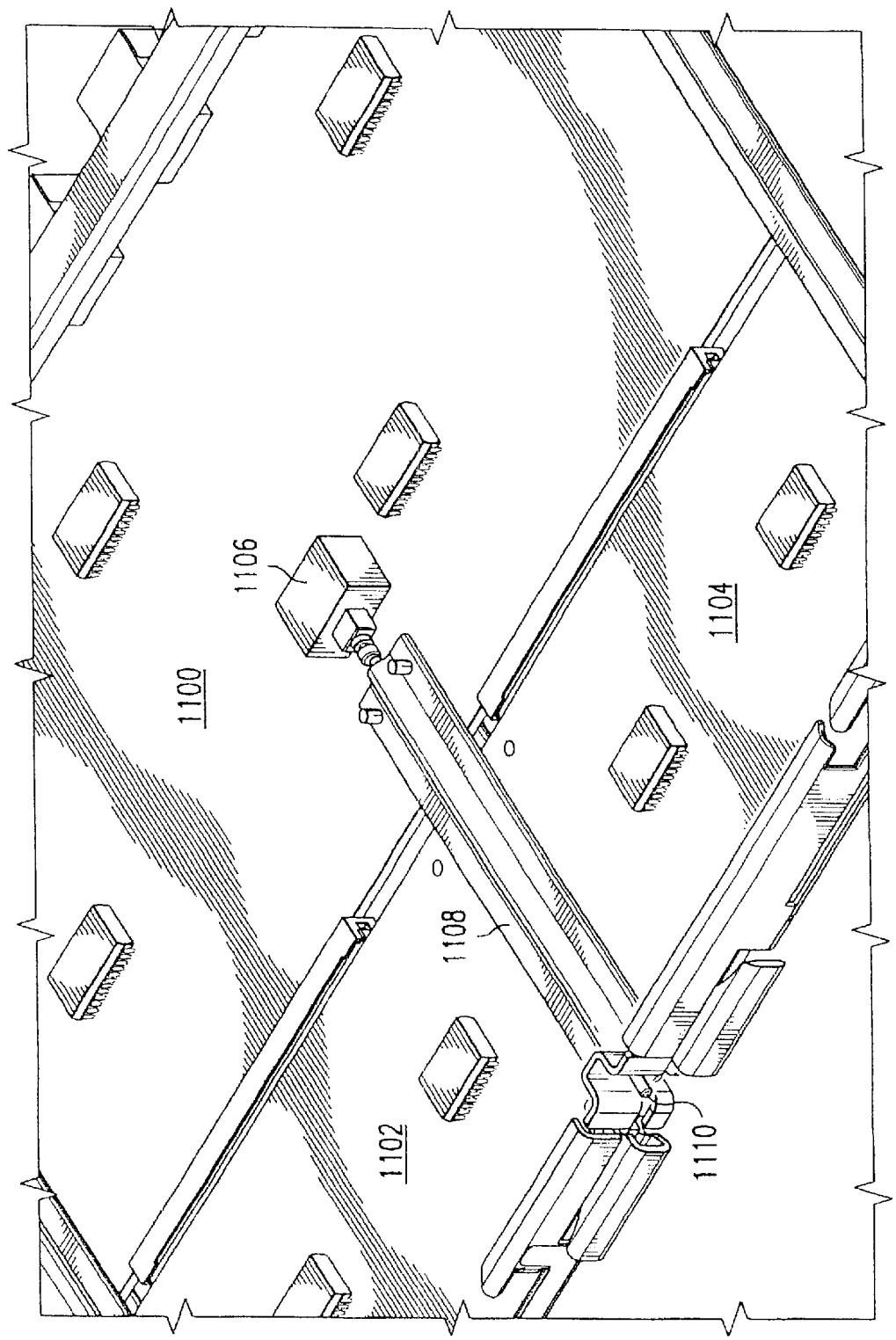
FIGS. 11A and 11B are schematic views illustrating a mother board and a daughter board with a reset switch constructed according to the present invention that may be employed to reset the components of a motherboard.
Figure 11B:
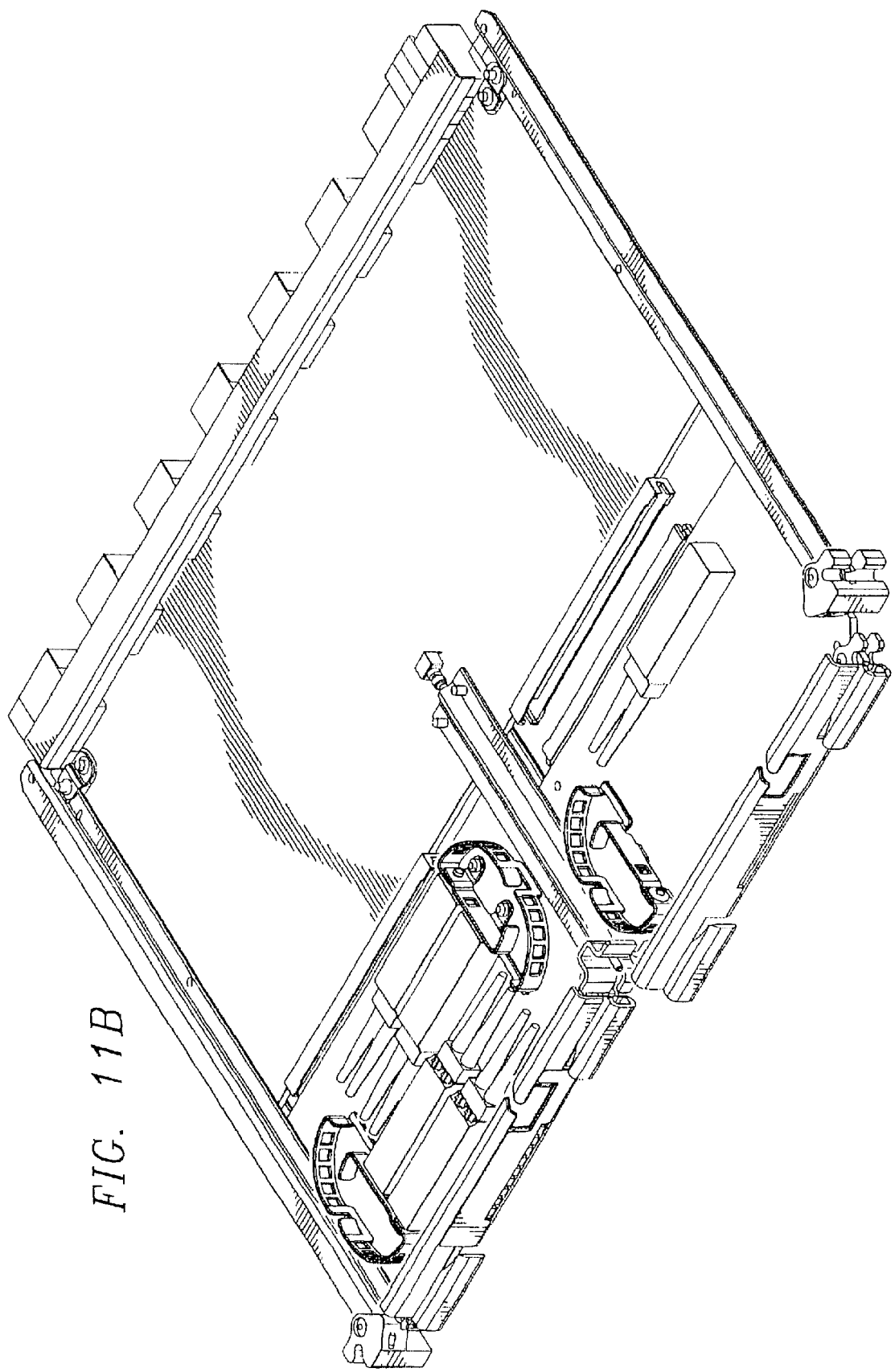

FIGS. 11A and 11B are schematic views illustrating a motherboard and a daughter board with a reset switch constructed according to the present invention that may be employed to reset the components of a motherboard. A motherboard 1100 couples to daughter boards 1102 and 1104. However, the components of the motherboard 1100 are not accessible directly without removing the daughter boards 1102 and 1104 from the motherboard 1100. Thus, a card guide 1108 includes a reset switch 1110 that moves within the card guide 1108 and couples to a reset device 1106. This reset device 1106, when activated via the reset switch 1110, causes the motherboard 1100 to enter a reset mode. Thus, when the motherboard 1100 enters an inoperative state, it may be reset without removing daughter boards 1102 and 1104 from the motherboard 1100 and from the housing.

Figure 12:
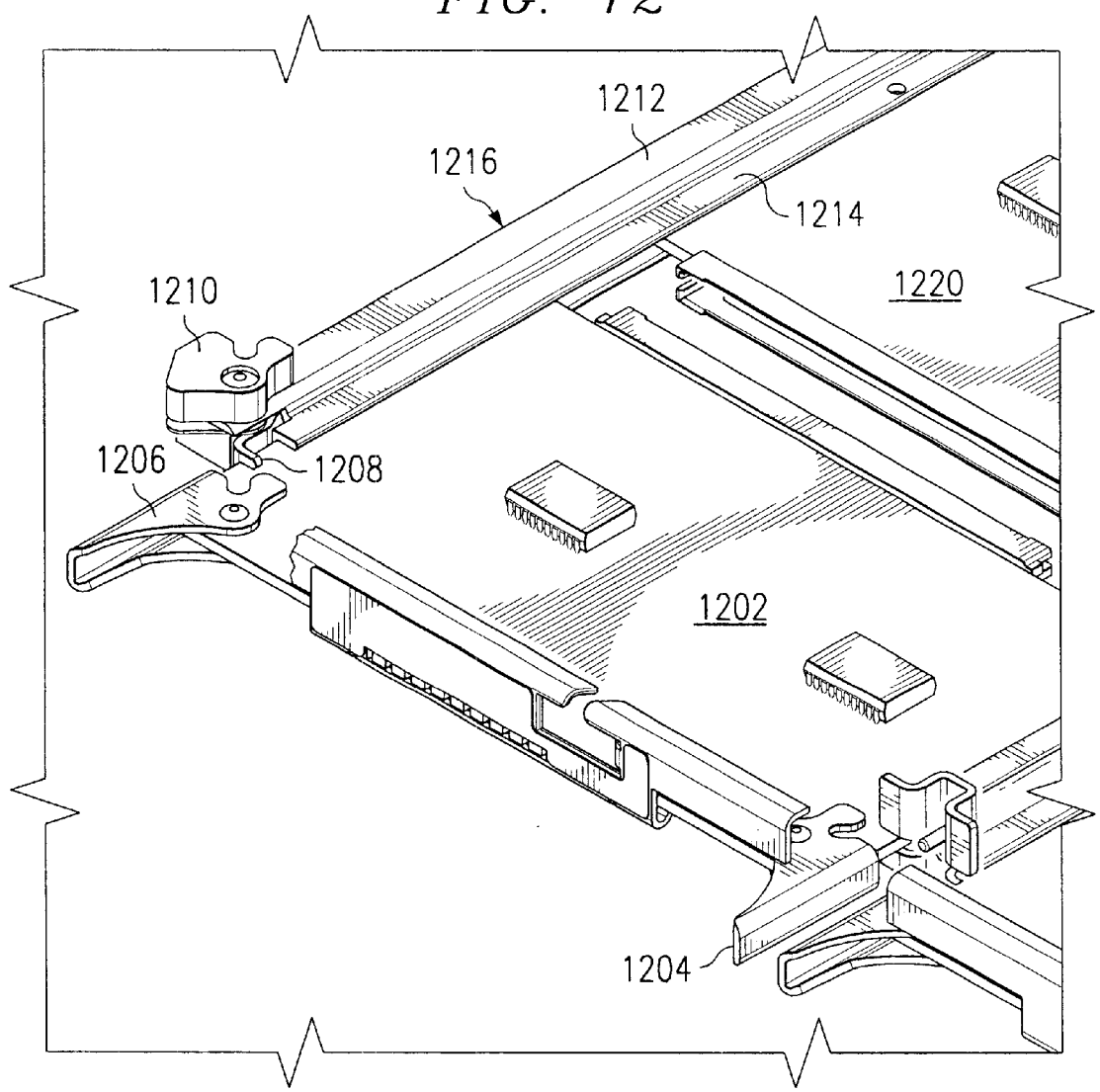
FIG. 12 is a schematic view illustrating the structure of motherboard and daughter board extractors constructed according to the present invention.

FIG. 12 is a schematic view illustrating the structure of motherboard and daughter board extractors constructed according to the present invention. As shown in FIG. 12, a daughter board 1202 includes extractors 1204 and 1206. Extractor 1204 engages an extraction surface fixed to the daughter board 1202. A motherboard extractor 1210 pivotally attaches to a first portion 1212 of a card guide 1216 and engages the enclosure (not shown). Further, extractor 1206 engages an extraction surface 1208 fixed to a second portion 1214 of the card guide 1216.

In the illustrated embodiment, each of the extractors 1204 and 1206, and motherboard extractor 1210 includes an actuator and an extraction surface. A person uses respective actuators to move the extractors 1204 and 1206, and motherboard extractor 1210 between engaged positions and released positions. However, it may be advantageous to further prevent unintentional W actuation of the motherboard extractor 1210. Thus, in another embodiment, the motherboard extractor 1210 does not include an actuator that may be grasped, but, instead, includes a slot that receives a screwdriver or a similar tool, with such tool required to move the motherboard extractor 1210 from an engaged position to a released position. In this fashion, the motherboard extractor 1210 cannot be disengaged from the enclosure without the use of a tool. As is evident, the use of extractors 1204 and 1206 allow the daughter board 1202 to be disengaged from a motherboard 1220.

Figure 13:
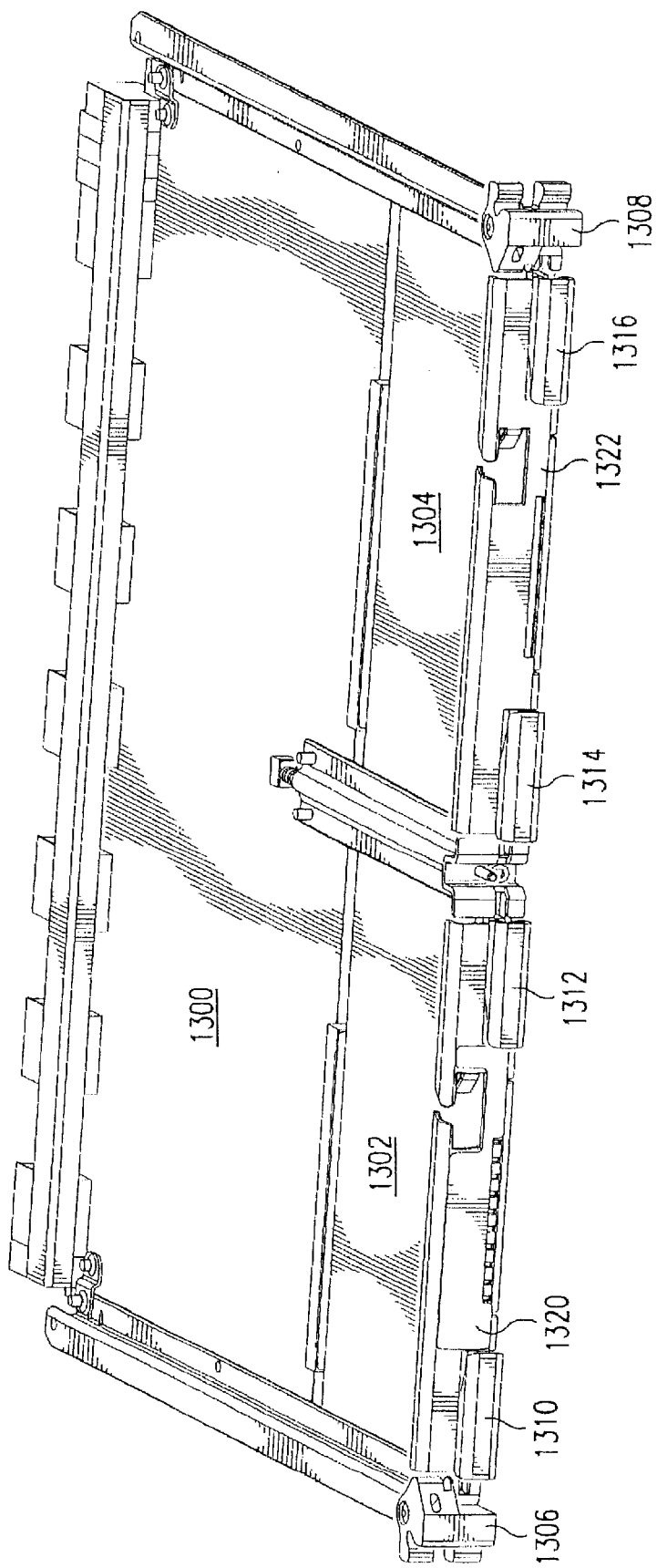
FIG. 13 is a schematic view illustrating daughter boards that are engaged within a motherboard according to the present invention.

FIG. 13 is a schematic view illustrating daughter boards that are engaged within a motherboard according to the present invention. The view of FIG. 13 shows a motherboard 1300 with which daughter boards 1302 and 1304 are matingly engaged. Extractors 1306 and 1308 are used to engage and remove the motherboard 1300 from an enclosure. Extractor 1306 is shown in an engaged position even though the motherboard 1300 is removed from the enclosure. Extractors 1306 and 1308 are shown in a released position.

Daughter board 1302 includes extractors 1310 and 1312. Daughter board 1304 includes extractors 1314 and 1316. Each of the extractors 1310, 1312, 1314, and 1316 is in the engaged position. As is shown, the daughter board extractors 1310, 1312, 1314, and 1316 are in the engaged position and their front edges are flush with the front edge of motherboard 1300, as well as with the front edge of motherboard extractor 1306 that is in the engaged position. Further, the extractors in the engaged position are also flush with face plates 1320 and 1322 of daughter boards 1302 and 1304, respectively. The flush alignment of each of these components not only reduces the depth of the combination of the motherboard 1300 and daughter boards 1302 and 1304, but also assists in preventing EMI generated by the motherboard 1300 and daughter boards 1302 and 1304 from escaping from an enclosure in which these components are contained.

Figure 14:
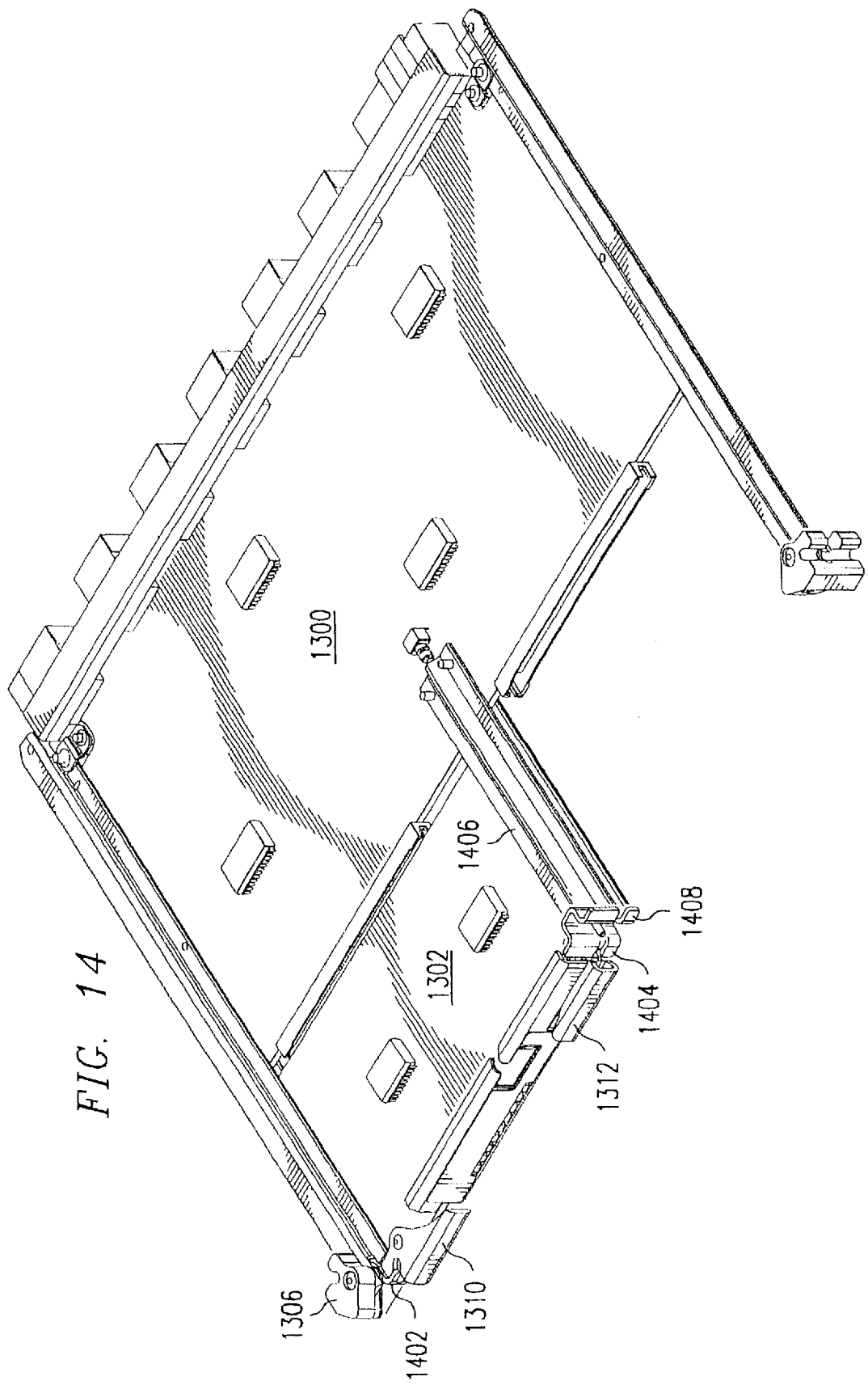
FIG. 14 is a schematic view of the motherboard with one daughter board removed therefrom illustrating the manner in which the daughter board engages the motherboard.

FIG. 14 is a schematic view of the motherboard with one daughter board removed therefrom illustrating the manner in which the daughter board engages the motherboard. As shown in FIG. 14, a motherboard 1300 and a daughter board 1302 are matingly engaged. In this engaged position, daughter board extractors 1310 and 1312 are in their engaged positions engaging extraction surfaces 1402 and 1404, respectively. As was previously- described, extraction surface 1402 is fixed to the second portion of the elongated guide. However, extraction surface 1404 is fixed to a daughter board track 1406, which, in turn, is fixed to motherboard 1300. As is also shown in FIG. 14, extraction surface 1408 is also affixed to the daughter board track 1406. The other daughter board 1304 (not shown) uses this extraction surface 1408 when matingly engaging the motherboard 1300.

Figure 15A:
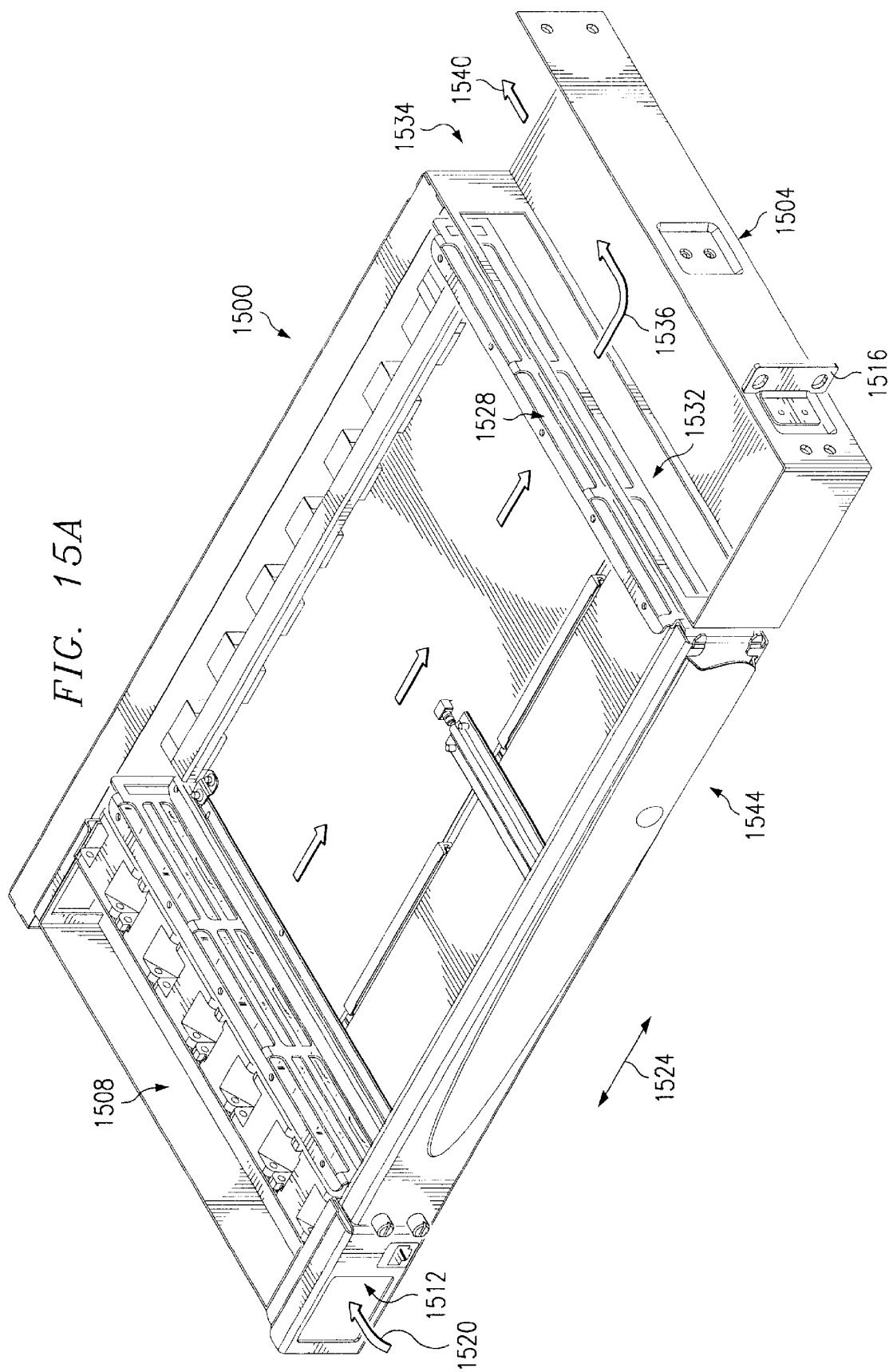
FIG. 15A is a perspective cutaway view of a nineteen-inch sub-assembly with an attached four-inch rack-mount extension formed to conduct exhaust from a rear side according to one embodiment of the present invention.

FIG. 15A is a perspective cutaway view of a nineteen-inch sub-assembly with an attached four-inch rack-mount extension formed to conduct exhaust from a rear side according to one embodiment of the present invention. As may be seen, a sub-assembly seen generally at 1500 is attached to a four-inch rack-mount extension shown generally at 1504. At an end opposite of the extension 1504, sub-assembly 1500 includes an area 1508 for receiving a fan tray.

A front side of sub-assembly 1500 includes an inlet port shown generally at 1512 for receiving air that is propelled through the sub-assembly 1500 by the fans of a fan tray once a fan tray is installed. As may also be seen, extension 1504 includes a bracket 1516 that is attached thereto to enable sub-assembly 1500 to be mounted within a rack having a twenty-three-inch form factor.

In operation, the fans of the fan tray draw air into the sub-assembly 1500 in direction 1520 through inlet port 1512. The air drawn in through inlet port 1512 is then propelled in a generally axial direction shown generally at 1524. The air is exhausted from sub-assembly 1500 through at least one exhaust port 1528. The extension 1504 then receives the exhaust through an inlet port shown generally at 1532 and conducts the air towards a rear exhaust port 1534 of the extension 1504 as is shown at 1536. The exhaust air is then expelled from the extension 1504 in a direction 1540 through extension 1504 rear exhaust port 1534. As may be seen in this diagram and with a comparison of the arrangement of the fiber optic couplers, the fiber optic couplers, when installed, are axially aligned with, the air flow within the sub-assembly 1500 in axial direction 1524. Moreover, a "front door" shown generally at 1544 is shown from which fiber optic fibers extend from the sub-assembly 1500.

In the described embodiment of the invention, the sub-assembly 1500 is formed of 18-gauge metal (0.048 inches thick) while the extension 1504 is formed of 16-gauge metal (0.060 inches thick). Additionally, extension 1504 forms openings sufficiently large enough to enable a tightening tool, such as an Allen wrench or a screwdriver, to be inserted therein to tighten screws that are used to firmly secure the extension to the sub-assembly 1500. Here, in the described embodiment, #8 captive screws with 32 threads per inch are used because they serve to easily and firmly attach the extension 1504 to the sub-assembly 1500. Alternate screws and methods for.attaching the extension 1504 may also be used. One reason the extension 1504 is formed of 16-gauge steel is to provide adequate strength of the extension put in a high shock and vibration environment.

Figure 15B:
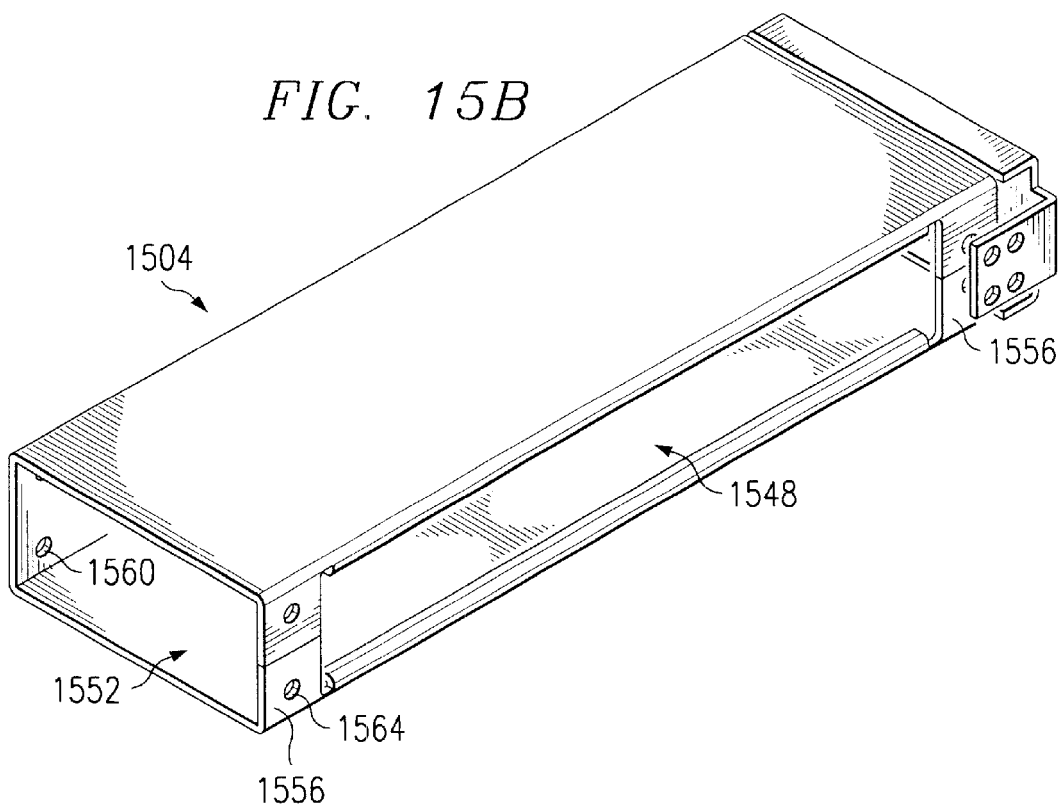
FIG. 15B is a perspective view of a four-inch rack-mount extension illustrating air inlet and exhaust ports.

FIG. 15B is a perspective view of a four-inch rack-mount w extension illustrating air inlet and exhaust ports. In the described embodiment of the invention, extension 1504 includes substantially closed top, bottom and sides, except for screw holes and air inlet and exhaust ports. Accordingly, extension 1504 is formed to not only be an extension to enable a nineteen-inch sub-assembly to be inserted into a rack having a twenty-three-inch form factor, but is also formed to be a duct to direct exhaust air that is expelled from a side of a sub-assembly towards a rear of a rack.

Sub-assembly extension 1504 forms an air inlet, shown generally at 1548, for receiving exhaust air from the sub-assembly and an air exhaust port, shown generally at 1552, through which exhaust air is expelled. As may also be seen, extension 1504 forms a plurality of mounting flanges 1556 for attaching the extension 1504 to a sub-assembly. Finally, a plurality of apertures 1560 through which a tightening tool, such as a screwdriver or Allen wrench, may be inserted to tighten captive panel screws that are attached at the apertures shown at 1564. While some exhaust air will escape from the apertures 1560 of extension 1504 for the tightening tool, most of the exhaust air will be expelled through exhaust port 1552.

Figure 15C:
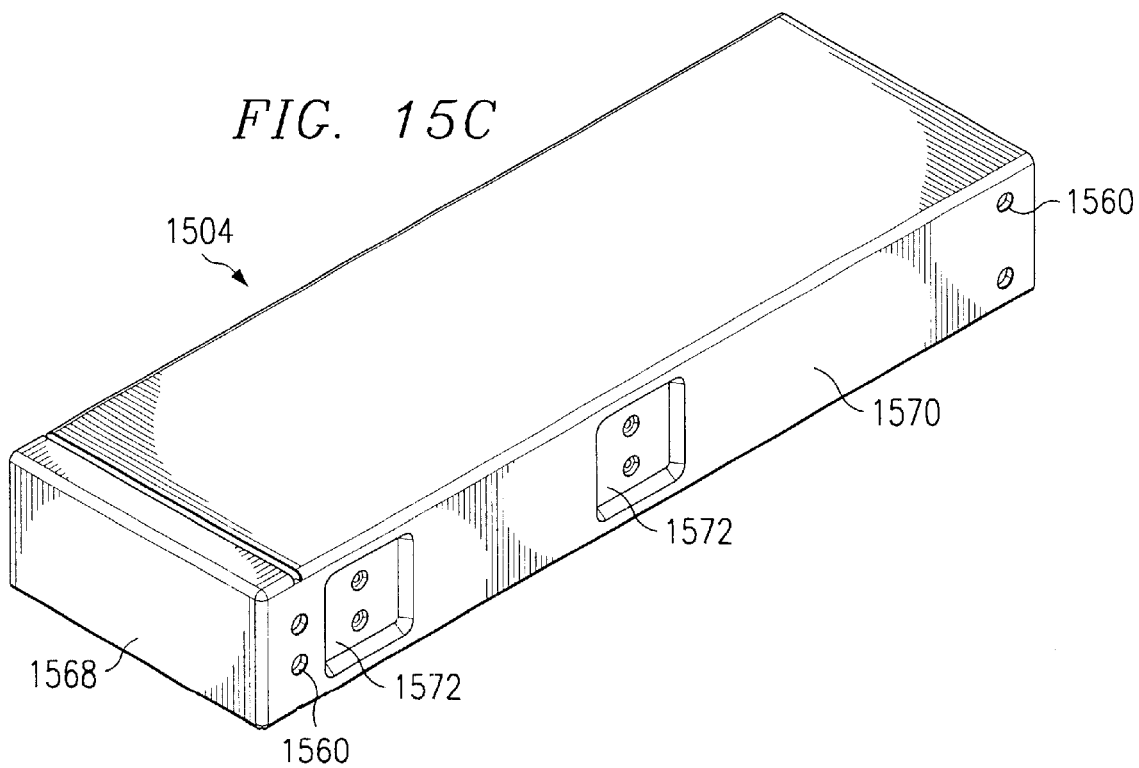
FIG. 15C is a perspective view of a four-inch rack-mount extension illustrating the closed sides having a plurality of embossments for receiving mounting hardware and further illustrating that the extension is formed to also be a duct for exhaust air according to one embodiment of the described embodiment.

FIG. 15C is a perspective view of a four-inch rack-mount extension illustrating the closed sides having a plurality of embossments for receiving mounting hardware and further illustrating that the extension is formed to also be a duct for exhaust air according to one embodiment of the described embodiment. Extension 1504 includes a closed end 1568 and a substantially closed side 1570. Substantially closed side 1570 includes apertures 1560 for receiving a tightening tool. Substantially closed side 1570 further includes a plurality of embossments shown generally at 1572 for receiving mounting hardware for attaching a sub-assembly 1500 with extension 1504 to a rack with a twenty-three-inch form factor. Embossments 1572 are formed to mate with and receive the mounting hardware 1516 of FIG. 15A.

FIG. 16 is a perspective view of a fan tray formed to receive and hold a plurality of fans for cooling a sub-assembly. Fan tray 1600 includes an inlet port 1602 that is similar to inlet port 1512 of FIG. 15A. A plurality of removable fans shown generally at 1604 is formed to have support flanges 1608 formed at the inlet and exhaust ends of the removable fans 1604. Support flanges 1608 are formed to provide structural rigidity to the fan and to be large enough to form mounting surfaces that are used to attach the fan to the fan tray 1600. In the described embodiment, support flanges 1608 further form apertures 1612 through which a mounting screw may be inserted. Additionally, in the described embodiment of the invention, support flanges 1608 are also formed to facilitate being riveted to the fan tray 1600 in the area generally formed at 1616. As may be seen, fan tray 1600 is formed to receive six fans. In addition to the two fans 1604 shown in FIG. 16, four fan-receiving stations 1620 are shown. Each of the installed fans receives inlet air that enters the fan tray through inlet port 1602 and expels the air in direction 1624 to cool circuit components of the sub-assembly.

Figure 17:
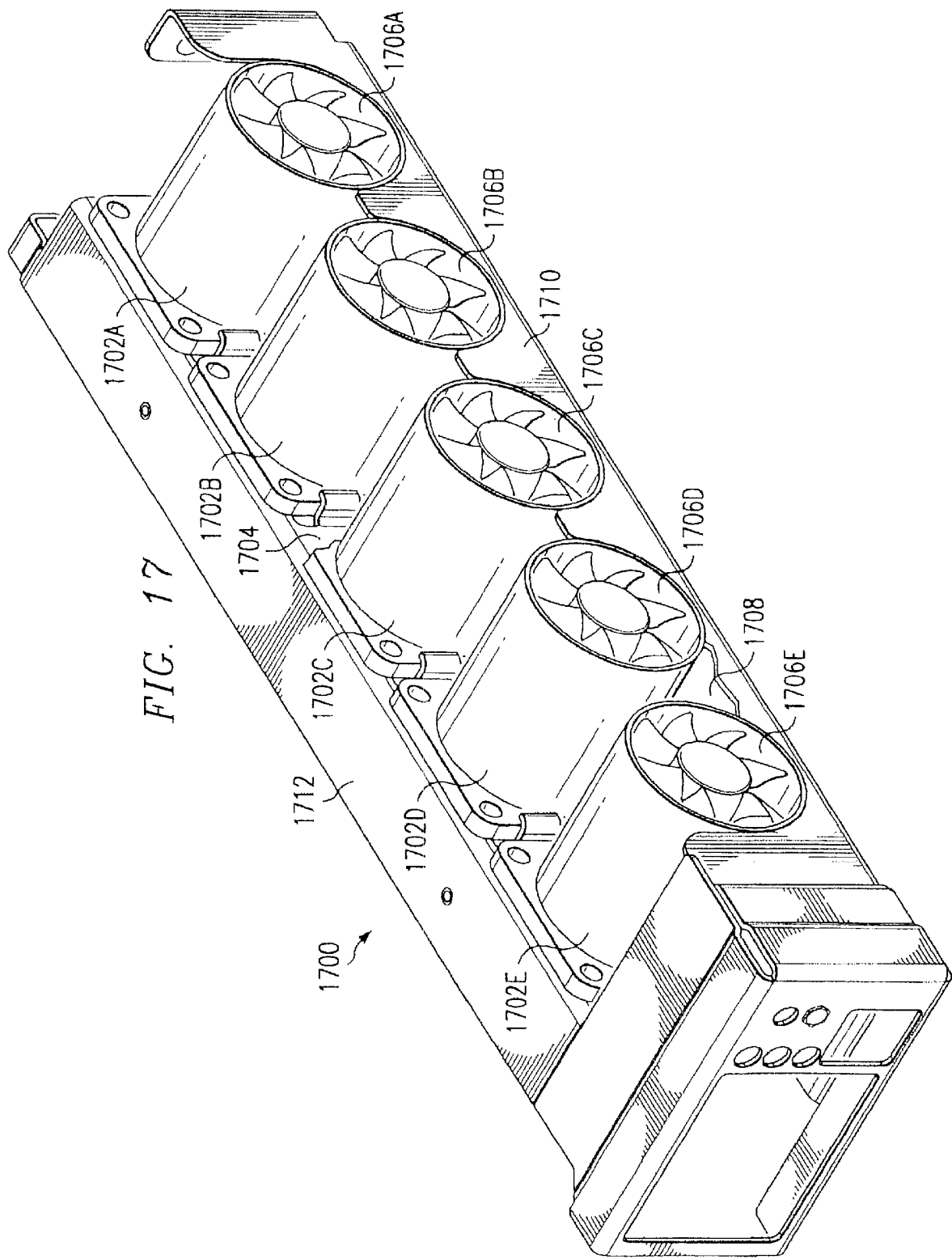
FIG. 17 is a schematic view of a multi-fan module constructed according to the present invention.

FIG. 17 is a schematic view of a multi-fan module constructed according to the present invention. The multifan module 1700 includes a plurality of fans 1702A through 1702E. The multi-fan module 1700 includes a front edge 1704 that has a plurality of front airflow apertures 1706A through 1706E. The plurality of fans 1702A through 1702E receive air via the front airflow apertures 1706A through 1706E. The multi-fan module also includes a bottom surface 1708 that vertically limits the engaged position of the plurality of fans 1706A through 1706E and a back surface 1710 that includes a plurality of back airflow apertures.

The multi-fan module 1700 also includes a top surface 1712 that cooperates with the enclosure to provide an air plenum opening through which air is received into the fans 1702A through 1702E. According to the operation of the multi-fan module 1700, air is received through the plurality of front airflow apertures 1706A through 1706E and produced from the back is airflow apertures (not shown). The back airflow apertures reside adjacent the enclosure volume within which the motherboard/daughter board combinations reside.

Figure 18:
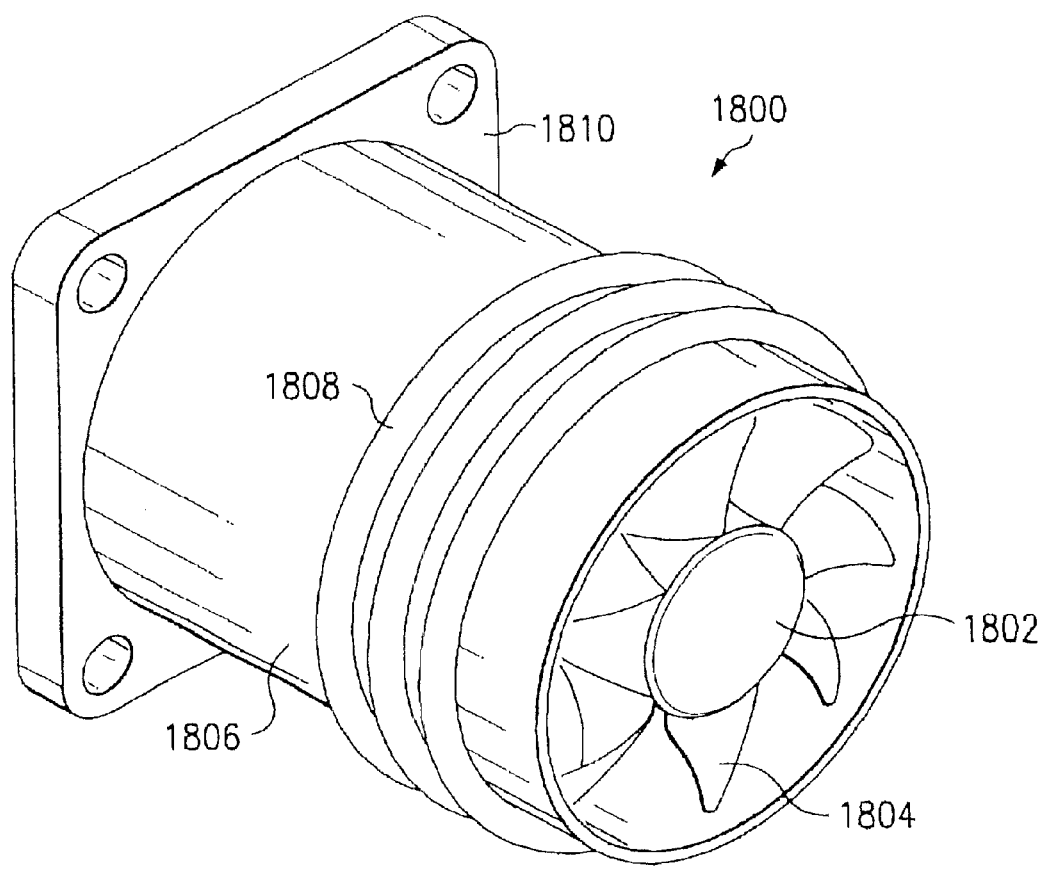
FIG. 18 is a schematic view of a fan constructed according to the present invention.

FIG. 18 is a schematic view of a fan constructed according to the present invention. A fan 1800 includes a fan, motor 1802, a plurality of fan blades 1804 coupled to the fan motor 1802, and a fan housing 1806 that houses the fan motor 1802 and the plurality of fan blades 1804. The fan 1800 also includes wiring 1808, which is attached to an external power source to power the fan motor 1802. The fan housing 1806 includes a flange 1810 located at one end of the fan housing 1806. This flange 1810 is received by fingers formed in the front edge of the multi-fan module to hold the fan 1800 in place within the multi-fan module.

Figure 19:
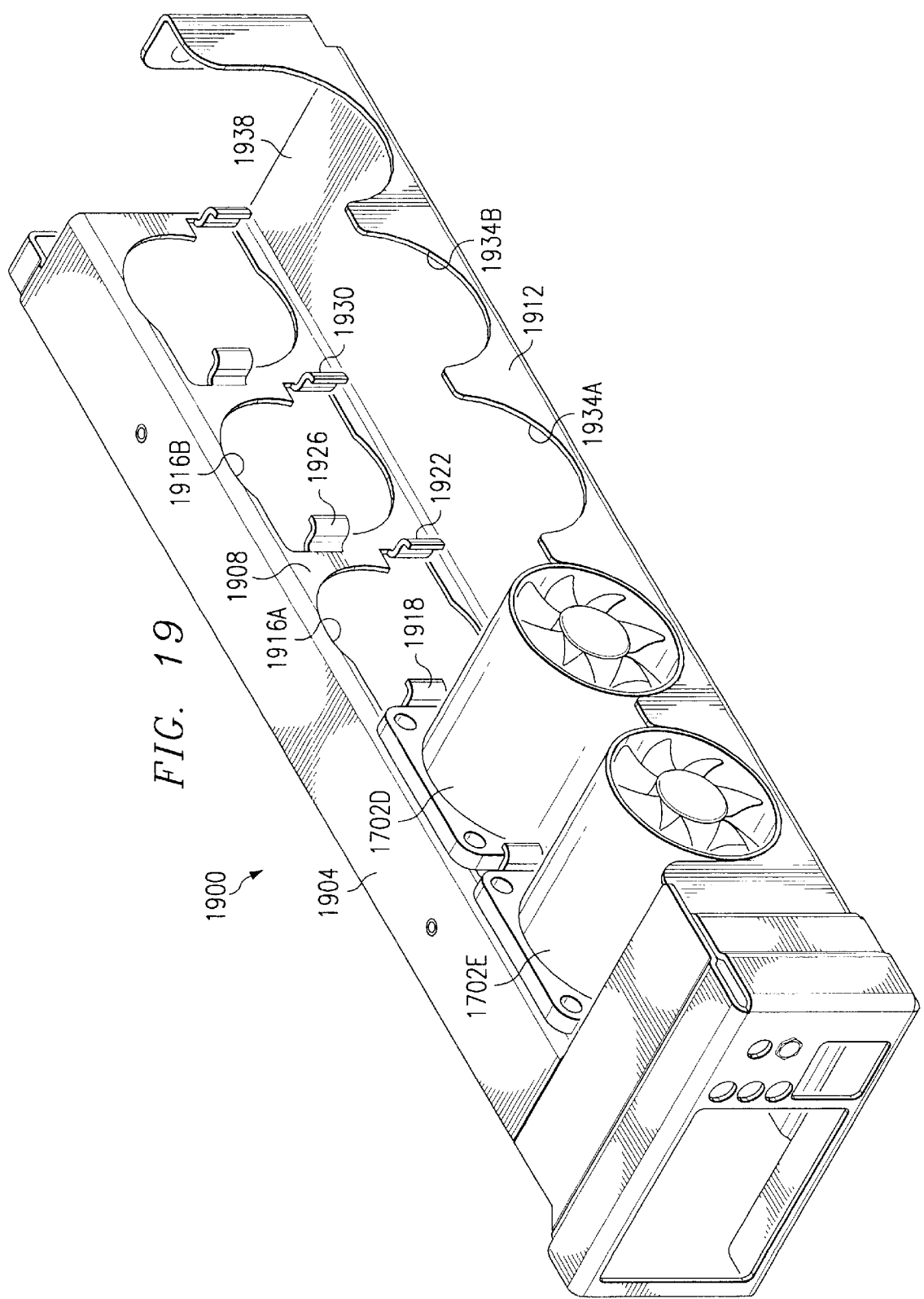
FIG. 19 is a schematic top view of a multi-fan module constructed according to the present invention with fans partially removed therefrom.

FIG. 19 is a schematic top view of a multi-fan module constructed according to the present invention with fans partially removed therefrom. As shown in FIG. 19, the multi-fan module 1900 includes a top surface 1904, a front edge 1908, and a back surface 1912. As is shown, front airflow apertures, 1916A and 1916B (as well as the other front airflow apertures) includes 2 fingers for holding the flange of a fan motor. In particular, front airflow aperture 1916A includes fingers 1918 and 1922. Further, front airflow aperture 1916B includes fingers 1926 and 1930. When corresponding fans are inserted in these positions, the fingers will receive the flanges of corresponding fan housings.

The back surface 1912 includes a plurality of back airflow apertures 1934A and 1934B that proximately limit backflow of air n about the fan housings that couple to the corresponding front airflow apertures. For example, back surface 1912 includes back airflow apertures 1934A and 1934B that, correspond to front airflow apertures 1916A and 1916B, respectively. When a fan matingly engages fingers, e.g., fingers 1918 and 1922 corresponding to front airflow aperture 1916A, and the fan moves against a bottom surface 1938, the back surface 1912 and, in particular, the back airflow aperture 1934A, engages the housing of the corresponding fan. In such case, this back airflow aperture 1934A limits the backflow of air about the sides of the fan.

Figure 20:
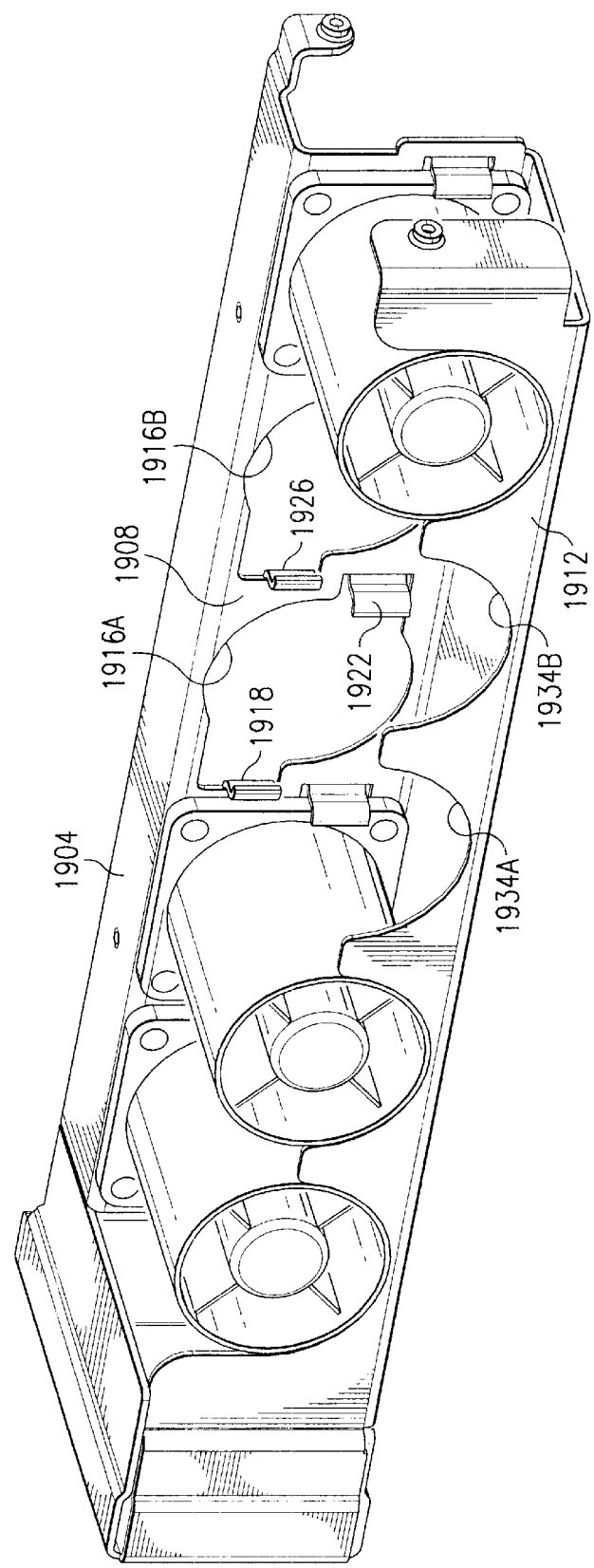
FIG. 20 is a schematic side view of a multi-fan module constructed according to the present invention.

FIG. 20 is a schematic side view of a multi-fan module constructed according to the present invention FIG. 20 provides additional detail from a different view of the fan assembly according to the present invention. In particular, a front airflow aperture 1916A is open from the view of FIG. 20. In such case, a back airflow aperture 1934A is evident as is back airflow aperture 1934B corresponding to front airflow aperture 1916B. Fingers 1906 and 1904 corresponding to front airflow aperture 1918 are shown to be formed in a front edge 1908 of the fan assembly.

Figure 21:
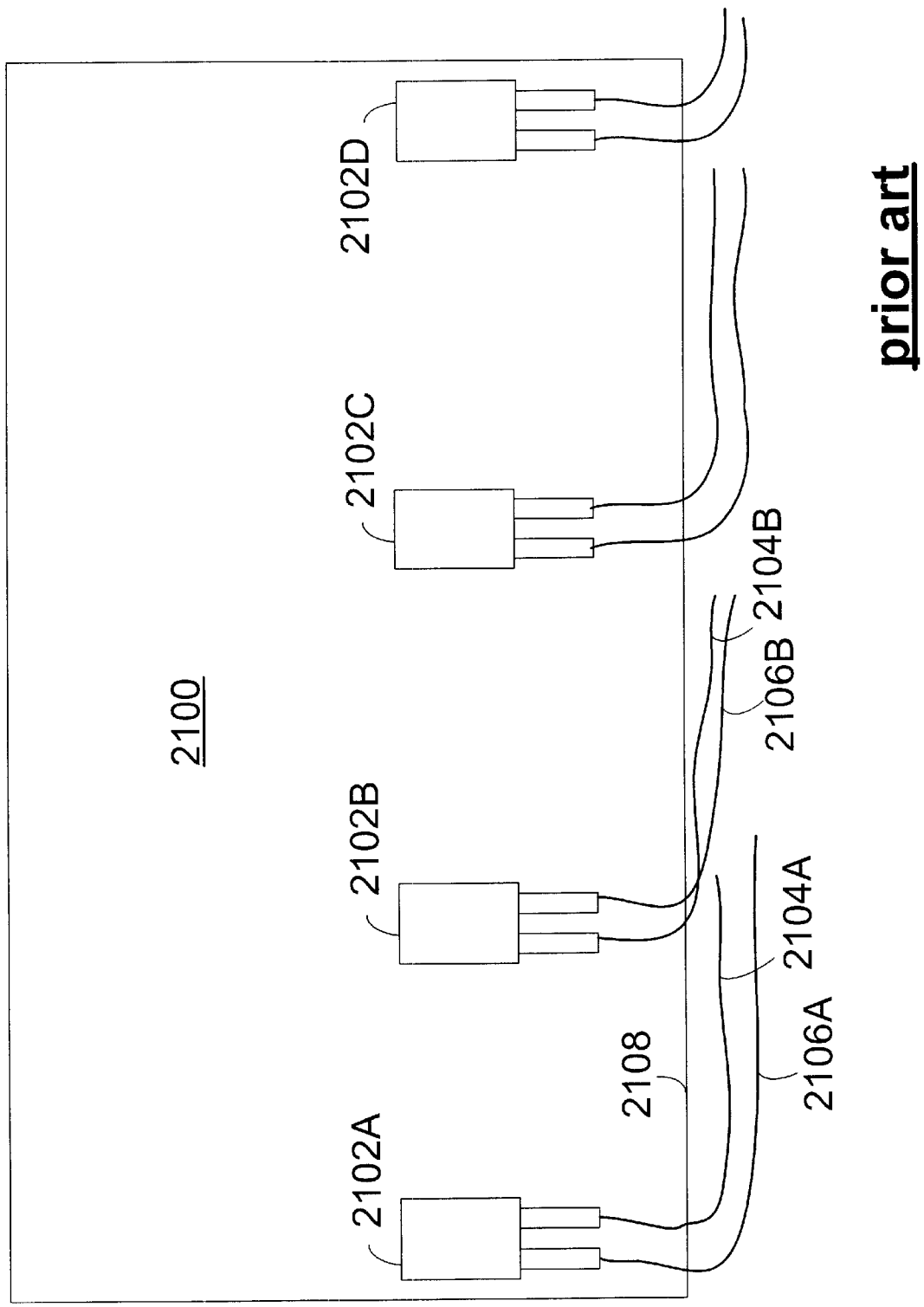
FIG. 21 is a schematic view of a prior art technique for coupling optical fiber media to a printed circuit board.

FIG. 21 is a schematic view of a prior art technique for coupling optical fiber media to a printed circuit board. FIG. 21 illustrates a circuit board 2100. Mounted upon circuit board 2100 are a plurality of optical fiber couplers 2102A, 2102B, 2102C, and 2102D, each of which receives a pair of optical fiber media. As is shown, the optical fiber media are received by the optical fiber couplers 2102A, 2102B, 2102C, and 2102D in a direction that is substantially perpendicular to a front edge 2108 of the circuit board 2100. The front edge 2108 of the circuit board 2100 is oriented such that when the circuit board 2100 is received within an opening, the front edge 2108 will be substantially parallel to the housing opening through which the circuit board 2100 is received.

Thus, with this orientation, the optical fiber media 2104A, 2104B, 2106A and 2106B are received within the optical fiber media coupler 2102 well away from the front edge 2108 of the integrated circuit board 2100. Such is the case because sufficient distance must remain between the optical fiber media couplers 2102A–2102D and the front edge 2108 of the circuit board 2100 so that the optical fiber media may be directed and extended from the housing in a direction substantially parallel to the front edge 2108 of the circuit board 2100. However, because a minimum bend radius is required so as not to damage the optical fiber media, the media couples 2102A–2102D must be set back a minimum distance from the front edge 2108 of the circuit board 2100. In the prior art embodiment of FIG. 21, therefore, the limitations involving the placement of the optical fiber media coupler resulted in wasted space on the integrated circuit board 2100.

Figure 22:
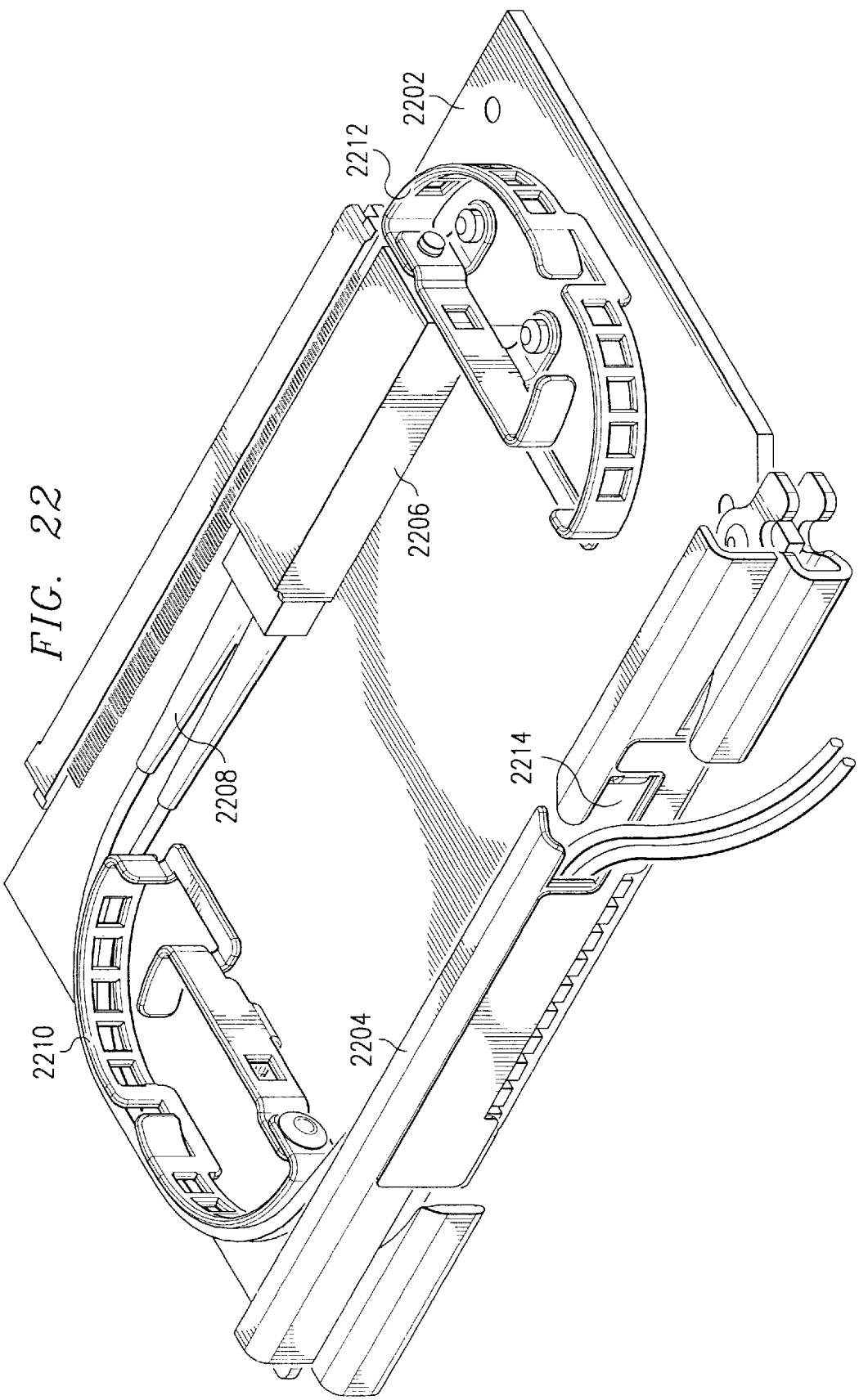
FIG. 22 is a schematic view of a daughter board constructed according to the present invention in which optical fiber media couples to the daughter board substantially parallel to a front edge of the daughter board.

FIG. 22 is a schematic view of a daughter board constructed according to the present invention in which optical fiber media couples to the daughter board substantially parallel to a front edge of the daughter board. As shown in FIG. 22, a daughter board 2202 includes a face plate 2204 fixed to, and parallel with, a front edge of the daughter board 2202. When engaged within the enclosure or another housing, the front edge of the daughter board 2202 will be substantially parallel to a surface of the front panel of the enclosure.

Fixed to the daughter board 2202 is an optical fiber media coupler 2206. The optical fiber media is disposed parallel to the front edge of the daughter board 2202 such that optical fiber media 2208 is received in a direction substantially parallel to a housing opening in which the daughter board 2202 is installed.

The daughter board 2202 also includes optical fiber media guides 2210 and 2212 installed on the daughter board 2202. The optical fiber media guide 2210 and 2212 each have a radius about which the optical fiber media 2208 are routed so that the optical fiber media 2208 extend from an opening 2214 in a direction that is substantially parallel to the housing opening. In this fashion, the optical fiber media 2208 and 2210 form a semi-circle with the minimum radius about the optical fiber media guide 2210. The radius of the optical fiber media guide 2210 is one which allows the media to be bent about the guide without damage.

Significantly, the daughter board 2202 may be constructed with a minimum depth that is sufficient to contain the optical fiber media coupler 2206. With the minimum depth, the daughter board 2202 uses a minimal depth of the available depth within the housing for the required integrated circuitry, i.e., the motherboard.

Figure 23:
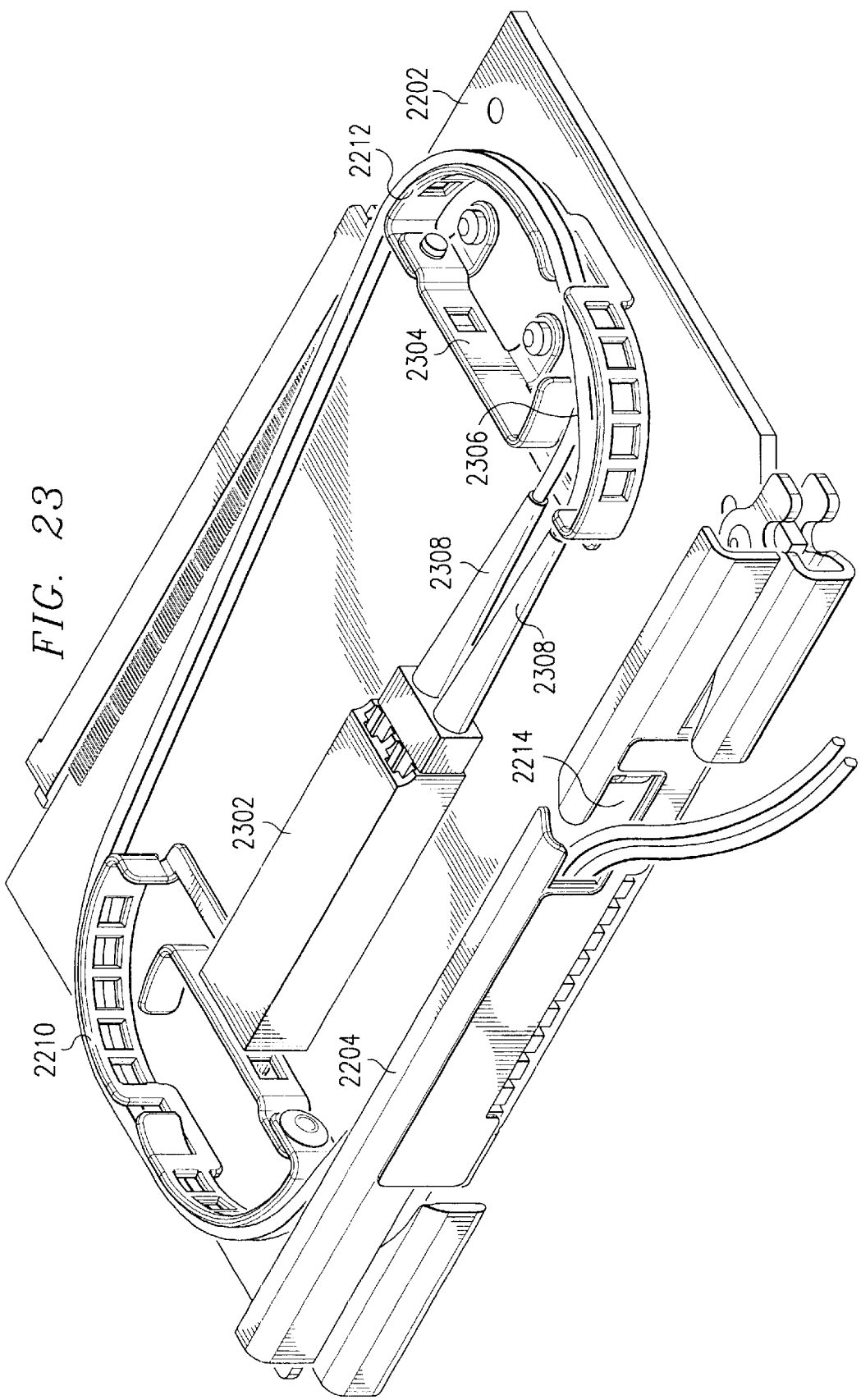
FIG. 23 is another view of a daughter board constructed according to the present invention showing the manner in which optical fiber media couples to the daughter board.

FIG. 23 is another view of a daughter board constructed according to the present invention showing the manner in which optical fiber media couples to the daughter board. As shown in FIG. 23, a daughter board 2202 includes an optical fiber media coupler 2302 that is mounted parallel to, but in an opposite direction, as compared to the optical fiber media coupler 2206 of FIG. 22. The daughter board 2202 includes the disposed optical fiber media guides 2210 and 2212 that were shown on daughter board 2202 of FIG. 22.

In the structure shown in FIG. 23, the optical fiber media coupler 2302 receives optical fiber media 2308. The optical fiber media 2308 is routed about the second optical fiber media guide 2212 and also about the optical fiber media guide 2210, such that the optical fiber media 2308 extends through the opening 2214 in the same direction as optical fiber media 2208 extends from the opening 2214 in FIG. 22.

Figure 24:
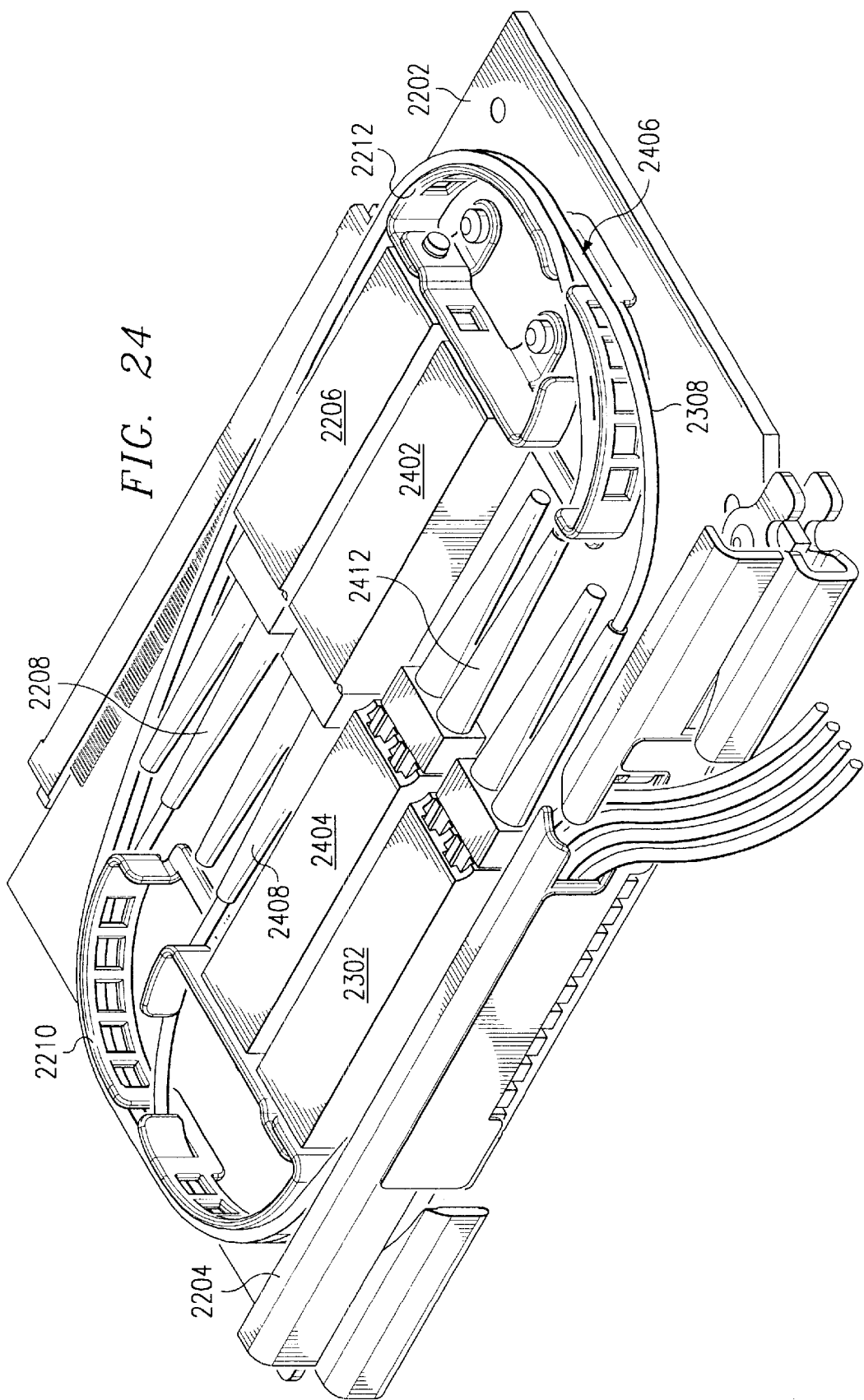
FIG. 24 is a diagrammatic top view of a daughter board constructed according to the present invention showing the manner in which optical fiber media couples to the daughter board.

FIG. 24 is a diagrammatic top view of a daughter board constructed according to the present invention showing the manner in which a plurality of optical fiber media couple to the daughter board. As shown, four optical fiber media couplers 2206, 2302, 2402, and 2404 are mounted upon a daughter board 2202. Optical fiber media 2208, 2308, 2408, and 2412 (each of which includes two optical fiber cables) couple to optical fiber media couplers 2206, 2302, 2402, and 2404, respectively.

As is shown, optical fiber media coupler 2206 couples to a surface of the daughter board that receives optical fiber media 2208 in a first direction that is parallel to the front edge of the daughter board. Further, optical fiber media coupler 2402 also couples to the surface of the daughterboard and receives optical fiber media 2408 in the first direction. Optical fiber media couplers 2302 and 2404 couple to the surface of the circuit board and receive optical fiber media 2308 and 2412, respectively, in a second direction that is substantially parallel to, but opposite, the first direction.

Optical fiber media guide 2212 couples to the surface of the daughter board and tangentially receives optical fiber media 2308 and 2412. Optical fiber media guide 2212 provides a routing path for the optical fiber media 2308 and 2412 in the manner shown. As illustrated, the optical fiber media guide 2212 includes an opening 2406 through which optical fiber media 2308 and 2412 are received. Thus, the optical fiber media guide 2212 provides different routing paths for optical fiber media 2308 and optical fiber media 2412.

Optical fiber media guide 2210 also tangentially receives optical fiber media 2308 and 2412 and provides a routing path for the optical fiber media 2308 and 2412. Optical fiber media guide 2210 also tangentially receives optical fiber media 2208 and 2408 and provides a routing path for the optical fiber media 2208 and 2408. In combination, the optical fiber media guides 2210 and 2212 provide routing paths so that the optical fiber media extend from the daughter board and a housing opening adjacent the front edge of the daughter board substantially parallel and in the same direction to the front edge of the daughter board. The routing paths provided prevent the optical fiber media 2208, 2308, 2408, and 2412 from being bent at a radius less than that provided by the optical fiber media guides 2210 and 2304.

Figure 25:
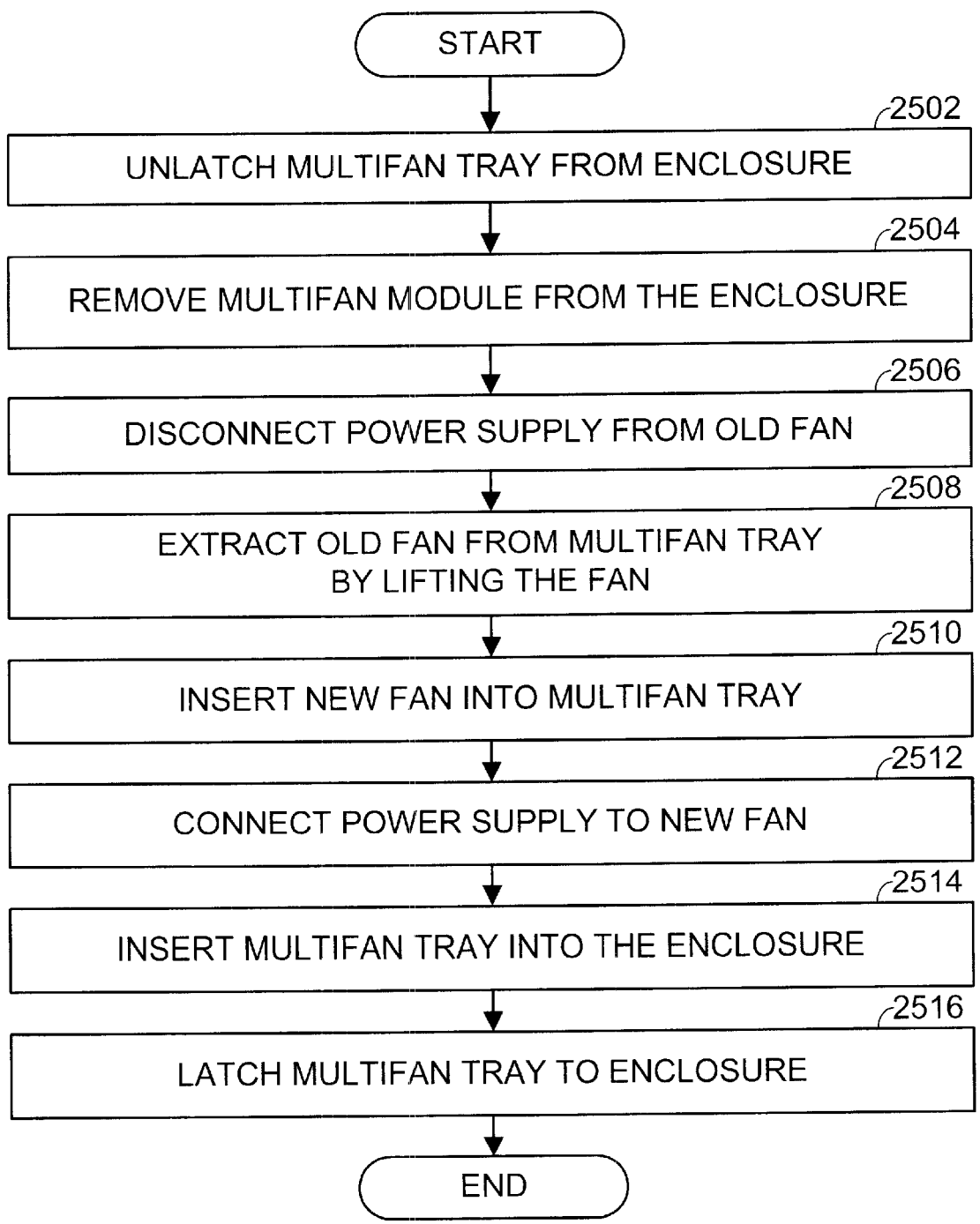
FIG. 25 is a logic diagram illustrating a method for inserting a fan into the multi-fan tray according to the present invention.

FIG. 25 is a logic diagram illustrating a method for inserting a fan into the multi-fan tray according to the present invention. The method requires first unlatching the multifan tray from an enclosure housing the multifan tray (step 2502). Then, the multifan tray is removed from the enclosure (step 2504). Next, the power supply is disconnected,from a failed fan of a plurality of fans held by the multifan tray (step 2506) The failed fan is extracted from the multifan tray by lifting the fan to remove a flange of the fan from a plurality of fingers formed in the multifan tray that slidingly engage the flange (step 2508).

With the failed fan removed, a new fan is inserted into the multifan tray by engaging a flange of the fan into the plurality of fingers formed in the multifan tray (step 2510). The new fan is then connected to the power supply (step 2512). Then, the multifan tray is inserted into the enclosure (step 2514). Finally, the multifan tray is latched into the enclosure (step 2516).

Figure 26:
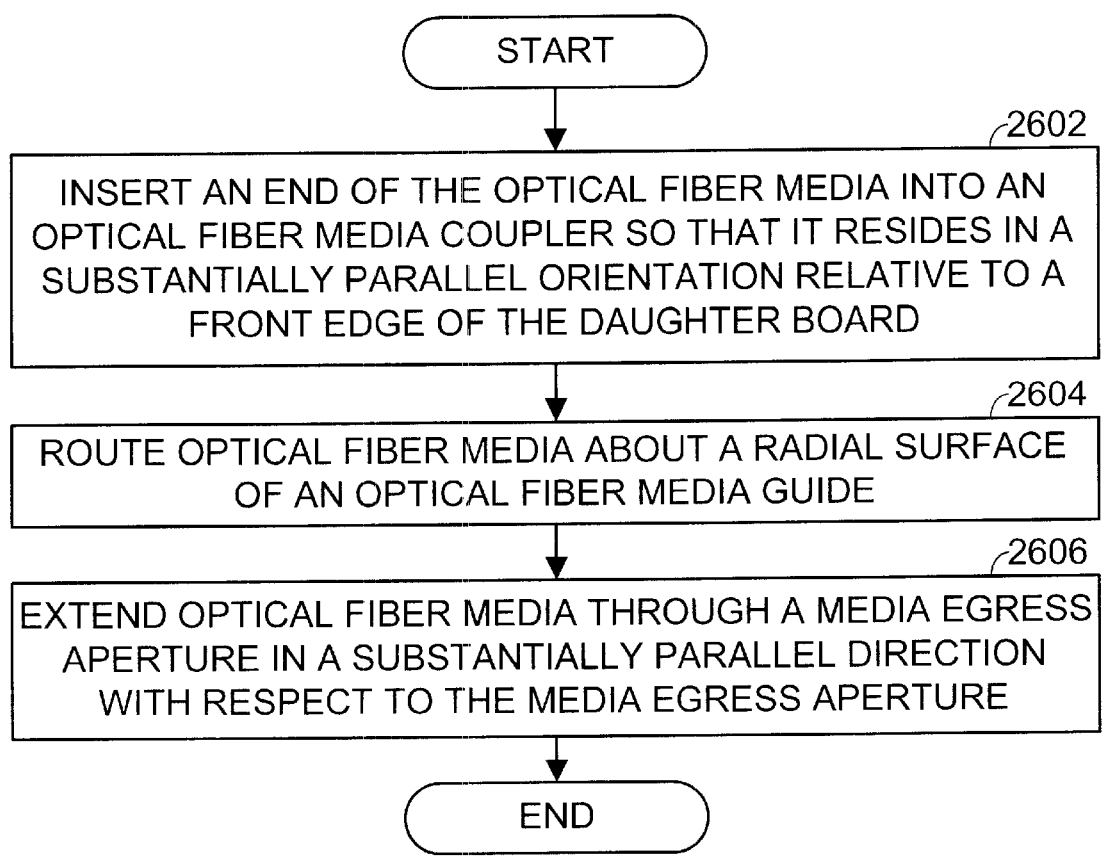
FIG. 26 is a logic diagram illustrating a method installing an optical fiber media onto a printed circuit board according to the present invention.

FIG. 26 is a logic diagram illustrating a method installing an optical fiber media onto a printed circuit board according to the present invention. According to this operation, an end of an optical fiber optic media is inserted into an optical fiber media coupler that resides in a substantially parallel orientation relative to a front edge of the printed circuit board (2602). Then, the optical fiber media is routed about a radial surface of an optical fiber media guide (step 2604). Finally, the optical fiber media is extended through a media egress aperture in a substantially parallel direction with respect to the media egress aperture (step 2606). The media egress aperture is referred to as 2214 in FIG. 22.

Figure 27:
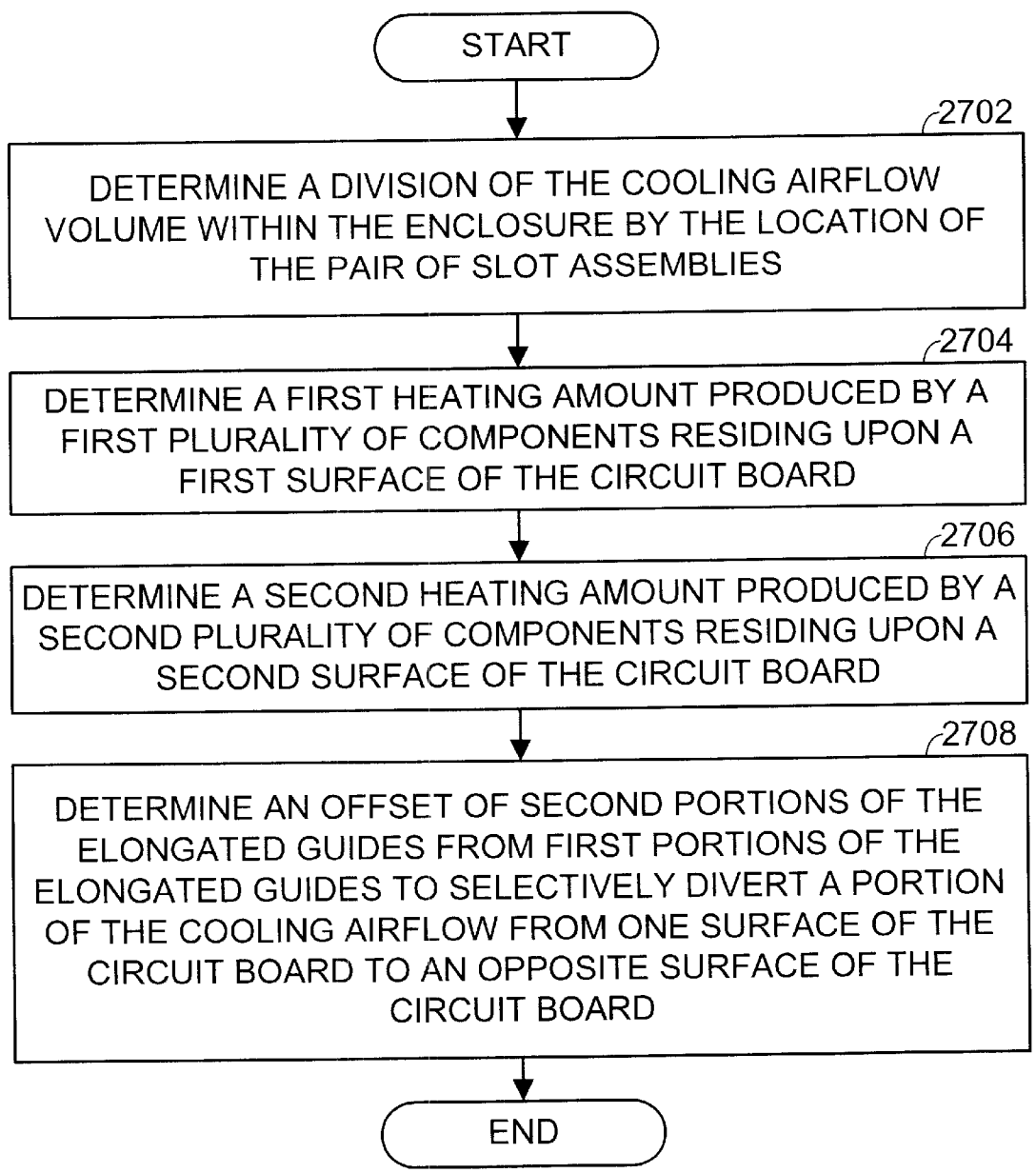
FIG. 27 is a logic diagram illustrating a method for constructing a card guide according to the present invention.

FIG. 27 is a logic diagram illustrating a method for constructing a card guide according to the present invention. According to this method, a pair of elongated guides are designed that affix to a circuit board and that allow the circuit board to be slidingly engaged within an enclosure. Within the enclosure is produced a cooling airflow and the enclosure includes a pair of slots that receive the pair of elongated guides. The method commences by determining a division of the cooling airflow volume within the enclosure by the location of the pair of slot assemblies (step 2702).

The method then proceeds with determining a first heating amount produced by a first plurality of components residing upon a first surface of the circuit board (step 2704). Then, a second heating amount produced by a second plurality of components residing upon a second surface of the circuit board is determined (step 2706). Finally, an offset of second portions of the elongated guides from first portions of the elongated guides is determined to selectively divert a portion of the cooling airflow from one surface of the circuit board to an opposite surface of the circuit board (step 2708). This method may be extended to design offsets for a plurality of elongated guides for a system containing a plurality of circuit boards.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A twenty-three-inch telecommunication rack sub-assembly system, comprising:
    a nineteen-inch sub-assembly formed to be installed in a telecommunication rack having a nineteen-inch form factor; and
    a four-inch extension formed to be attached to the nineteen-inch sub-assembly wherein the extension, when attached to the nineteen-inch sub-assembly, enables the sub-assembly to be installed in a twenty-three-inch telecommunication rack, wherein the four-inch extension is formed to receive and conduct exhaust air from a nineteen-inch sub-assembly side towards a rear side of the telecommunication rack sub-assembly system.

2. The system of claim 1 wherein the extension is formed to integrally mate with the nineteen-inch sub-assembly.

3. The system of claim 1 wherein the extension forms embossments to receive and be attached to mounting hardware for installing the system in the twenty-three-inch rack.

4. The system of claim 1 wherein the extension is formed out of 16-gauge metal while the sub-assembly is formed out of 18-gauge metal.

5. The system of claim 1 wherein the extension is formed of a heavier gauge of metal than is the sub-assembly.

6. The system of claim 1 wherein the extension defines a height that is equal to a height of the sub-assembly.

7. A method of retrofitting a nineteen-inch sub-assembly into a twenty-three-inch telecommunication rack, comprising:

attaching a four-inch extension device formed to operate as an air duct and to redirect exhaust air from a side of the nineteen-inch sub-assembly towards a rear side of the rack; and installing the nineteen-inch sub-assembly and four-inch extension into the twenty-three-inch rack.

8. A four-inch extension, comprising:

two substantially closed side panels adjacent to each other;

two substantially open sides adjacent to each other;

a closed top and bottom;

a plurality of mounting flanges for attaching the extension to a nineteen-inch sub-assembly; and a plurality of embossments for receiving mounting hardware for installing the sub-assembly and extension into a twenty-three-inch rack.

9. The extension of claim 8 wherein a first open side is for receiving exhaust air from the sub-assembly.

10. The extension of claim 9 wherein a second open side is for expelling exhaust air from the extension.

11. The extension of claim 10 wherein the second open side includes an aperture that is larger than an aperture of the first open side.

12. A method of conducting air in a sub-assembly system installed in a twenty-three-inch rack, comprising:

receiving air in a first direction in a fan tray;

propelling the air in a second direction, which second direction is substantially perpendicular to the first direction, the air being propelled in the second direction to cool electrical components formed on a sub-assembly; and expelling the air from the sub-assembly in the second direction;

receiving the air in an inlet port of an extension device formed to receive air exhausted from the sub-assembly in the second direction; and.

expelling the air as exhaust in a direction that is substantially the same as the first direction towards a rear side of the twenty-three-inch rack.

13. The method of claim 12 wherein the air is conducted along the second direction within the sub-assembly system for a length that is greater than a length that it is conducted in the first direction within the sub-assembly system.

* * * * *